(12) United States Patent
Chebi et al.

(10) Patent No.: US 8,757,178 B2
(45) Date of Patent: Jun. 24, 2014

(54) METHOD AND APPARATUS FOR REMOVING PHOTORESIST

(75) Inventors: Robert P. Chebi, San Carlos, CA (US); Jaroslaw W. Winniczek, Daly City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/241,087

(22) Filed: Sep. 22, 2011

(65) Prior Publication Data

US 2012/0006486 A1 Jan. 12, 2012

Related U.S. Application Data

(62) Division of application No. 12/257,216, filed on Oct. 23, 2008, now Pat. No. 8,043,434.

(51) Int. Cl.
*B08B 7/00* (2006.01)
*H01L 21/00* (2006.01)

(52) U.S. Cl.
USPC .... 134/99.1; 134/95.1; 134/902; 156/345.29; 156/345.35; 156/345.38

(58) Field of Classification Search
None
See application file for complete search history.

(56) References Cited

U.S. PATENT DOCUMENTS

| | | | |
|---|---|---|---|
| 6,203,657 B1 * | 3/2001 | Collison et al. | 156/345.48 |
| 6,599,438 B2 | 7/2003 | Levenson et al. | |
| 6,777,173 B2 | 8/2004 | Chen et al. | |
| 6,991,739 B2 | 1/2006 | Kawaguchi et al. | |
| 2004/0154743 A1 | 8/2004 | Savas et al. | |
| 2005/0022839 A1 | 2/2005 | Savas et al. | |
| 2005/0136604 A1 * | 6/2005 | Al-Bayati et al. | 438/301 |
| 2006/0219361 A1 | 10/2006 | Wang et al. | |
| 2006/0231207 A1 * | 10/2006 | Rebinsky et al. | 156/345.41 |
| 2007/0193602 A1 | 8/2007 | Savas et al. | |
| 2007/0264841 A1 | 11/2007 | Chebi et al. | |
| 2008/0000530 A1 * | 1/2008 | Sun et al. | 137/487.5 |
| 2008/0078744 A1 | 4/2008 | Wang et al. | |
| 2008/0081483 A1 | 4/2008 | Wu | |
| 2008/0131821 A1 | 6/2008 | Sandstrom | |
| 2008/0153306 A1 | 6/2008 | Cho et al. | |
| 2008/0178913 A1 | 7/2008 | Collins et al. | |

OTHER PUBLICATIONS

Mertens et al., "Post-etch Residue and Photoresist Removal Challenges for the 45 nm Technology Node and Beyond," Semiconductor Fabtech, $31^{st}$ Edition, Sep. 1, 2006.
Search Report dated Apr. 27, 2010 from International Application No. PCT/US2009/060066.
Written Opinion dated Apr. 27, 2010 from International Application No. PCT/US2009/060066.

* cited by examiner

*Primary Examiner* — Nicole Blan
(74) *Attorney, Agent, or Firm* — Beyer Law Group LLP

(57) ABSTRACT

A method and apparatus remove photoresist from a wafer. A process gas containing sulfur (S), oxygen (O), and hydrogen (H) is provided, and a plasma is generated from the process gas in a first chamber. A radical-rich ion-poor reaction medium is flown from the first chamber to a second chamber where the wafer is placed. The patterned photoresist layer on the wafer is removed using the reaction medium, and then the reaction medium flowing into the second chamber is stopped. Water vapor may be introduced in a solvation zone provided in a passage of the reaction medium flowing down from the plasma such that the water vapor solvates the reaction medium to form solvated clusters of species before the reaction medium reaches the wafer. The photoresist is removed using the solvated reaction medium.

14 Claims, 20 Drawing Sheets

METHOD AND APPARATUS FOR REMOVING PHOTORESIST

CROSS REFERENCE TO RELATED APPLICATION

This application is a Divisional of and claims benefit of priority to U.S. patent application Ser. No. 12/257,216 filed Oct. 23, 2008, now U.S. Pat. No. 8,043,434, which is incorporated herein by reference.

BACKGROUND OF THE INVENTION

The present invention relates to the formation of semiconductor devices. More specifically, the present invention relates to removal of photoresist.

During semiconductor wafer processing, features of the semiconductor device are defined in the wafer using well-known patterning and etching processes. Photoresist (PR) is used to protect some areas of the wafer from etch chemistries so as to define the features. Photoresist is also used as ion implantation masks for implanting a dopant into a silicon substrate. Conventionally, photoresist masks are removed by a "wet" process in back end of line (BEOL) processing, for example, after metallization, while a "dry" process is used in front end of line (FEOL) processing, for example, after ion implantation that characterizes devices. However, dry stripping may be used in the BEOL processing, and wet stripping may be used in the FEOL processing. Dry photoresist strip may be conducted either in a downstream environment or in a direct low bias-potential plasma. In FEOL processing, active areas (Si or SiGe), doped or undoped, are subjected to various levels of implants, followed by photoresist strip and post strip cleans.

Effects on active area from dry or wet processes can be detrimental from a material or dopant loss prospective. Material loss can occur as the active area is subjected to repetitive strip-and-cleans or etch processes. Material loss is generally defined as the conversion of active species such as silicon or dopants to their inactive compounds such as oxides. As material loss increases, various device characteristics, such as drive current, leakage, resistivity, and short channel effects, also change. Device sensitivity to material loss increases even further as device geometries decrease 45 nm and beyond, where junctions are shallower and more lightly doped by high-flux, low-energy ion implantation. Active area characteristics are a precision-engineered part of any device for optimum performance, and therefore, material loss due to FEOL processing—such as post ion implant strip (PIIS), may be detrimental to device performance. Furthermore, the ions implanted in the photoresist chemically modify the near-surface regions, causing decomposition, cross-linking, etc., of the photoresist. Such chemically modified regions form a hard crust, where the polymer may become graphitic in nature. Such a hard crust is typically formed in the upper resist region and at exposed sidewalls.

In order to avoid material loss due to ion bombardment in dry strip processes, improved wet processes with a hot sulfuric acid have also been used. However, typical wet photoresist strip chemistries, such as hot Piranha solutions (H2SO4: H2O2), do not work well when such crusts exist. In order to strip such crusts, aggressive plasma strip chemistries are being used, which typically include highly oxidizing radicals. To enhance the crust strip, the wafer may be heated, and fluorine (F)-containing species may be added to the plasma. However, use of such harsh chemicals (i.e., reduction or fluorination) and/or oxidation leads to Si material loss as well as dopants and Ge, which impacts device performance.

SUMMARY OF THE INVENTION

To achieve the foregoing and in accordance with the purpose of the present invention, a method for removing photoresist from a wafer is provided. The wafer has a patterned photoresist layer thereon. A process gas containing sulfur (S), oxygen (O), and hydrogen (H) is provided, and a plasma is generated from the process gas in a first chamber. A radical-rich ion-poor reaction medium is flown from the first chamber to a second chamber where the wafer is placed. The patterned photoresist layer on the wafer is removed using the reaction medium, and then the reaction medium flowing into the second chamber is stopped.

In another manifestation of the invention, water vapor is introduced in a solvation zone provided in a passage of the reaction medium flowing down from the plasma such that the water vapor solvates the reaction medium to form solvated clusters of species before the reaction medium reaches the wafer. The photoresist is removed using the solvated reaction medium. The solvation zone may be provided in the first chamber downstream of the plasma, and the reaction medium is solvated before the reaction medium enters into the second chamber. Alternatively, the solvation zone may be provided in the second chamber.

In another manifestation of the invention, an apparatus for removing photoresist from a wafer is provided. The apparatus includes a first chamber for generating a plasma from a process gas, a gas source, a second chamber, and a reaction medium distribution section. The first chamber has a gas inlet, and the gas source is in fluid connection with the gas inlet. The gas source provides the process gas containing sulfur (S), oxygen (O), and hydrogen (H) into the first chamber. The wafer having a patterned photoresist layer thereon is placed in the second chamber. The reaction medium distributing section flows a radical-rich ion-poor reaction medium from the plasma in the first chamber to the second chamber. A water vapor inlet is provided to the second chamber or the reaction medium distribution section. The water vapor inlet introduces water vapor in a solvation zone provided in a passage of the reaction medium flowing from the plasma to the wafer such that the water vapor solvates the reaction medium to form solvated clusters of species before the reaction medium reaches the wafer. The water vapor inlet may include a nozzle which is configured to inject the water vapor so as to condensate as clusters around the species.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
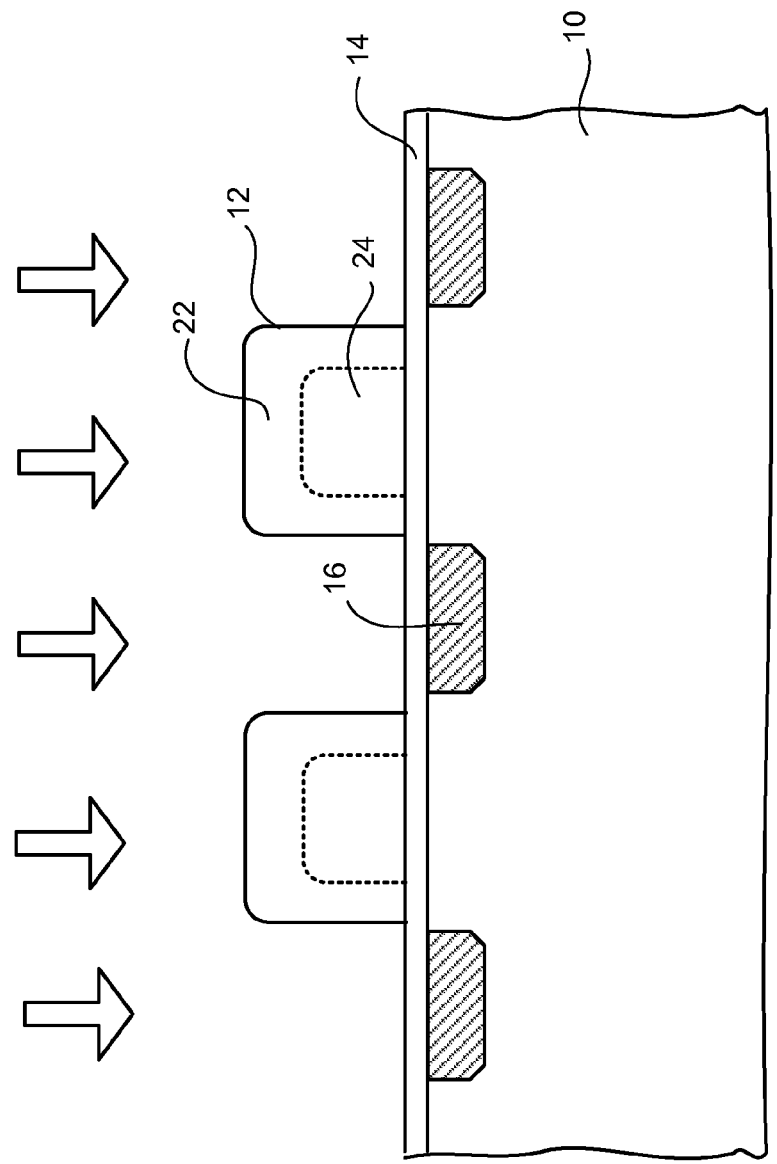
FIGS. 1A and 1B are schematic cross-sectional views of examples of a substrate having a photoresist mask for ion implantation.
Figure 1B:
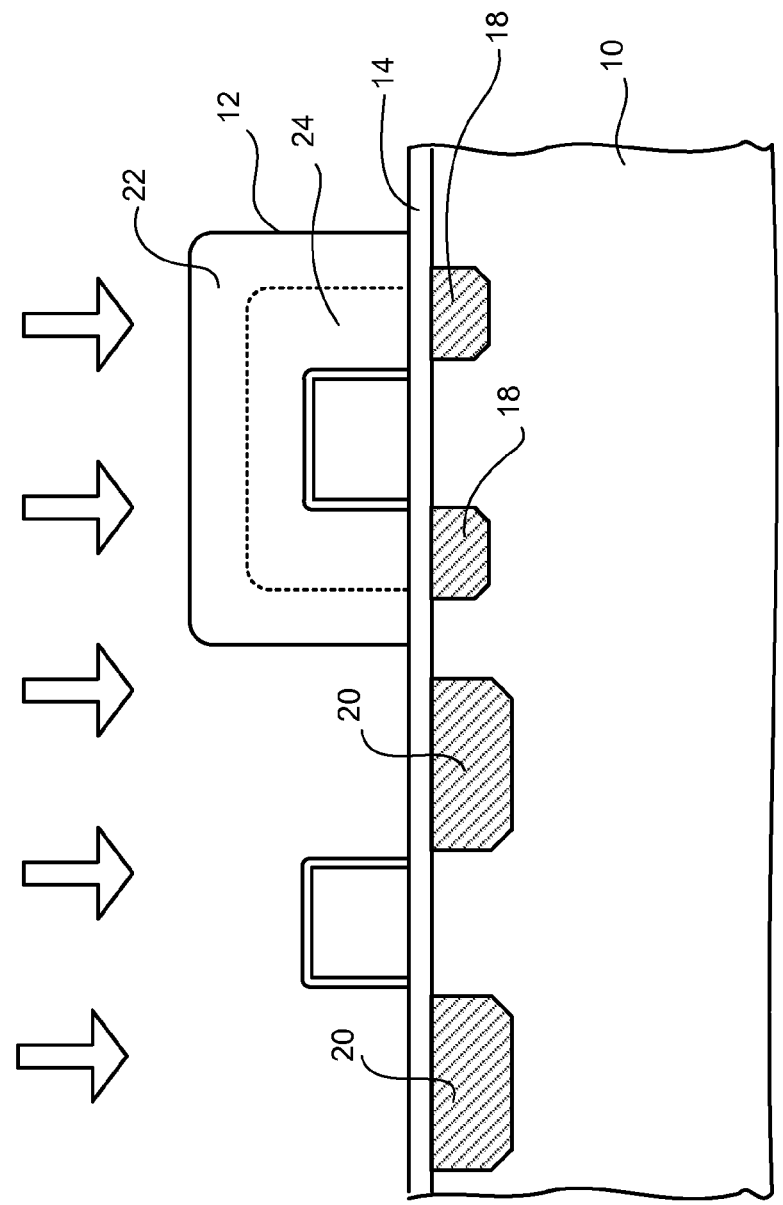

FIGS. 1A and 1B schematically illustrate a cross-sectional view of examples of a substrate 10 having a photoresist mask 12 for ion implantation. The substrate 10 may also include a thin dielectric layer 14. The photoresist mask 12 has features which define active areas 16 where dopants are injected, as shown in FIG. 1A. The photoresist mask 12 may also be used, as shown in FIG. 1B, for example, to protect a p-type device area 18 when active areas 20 for an n-type device are formed by ion implantation. After the ion implantation, the near-surface regions of the photoresist mask are chemically modified by ion injection, forming a hard crust 22 covering a bulk portion 24.

In general, downstream photoresist stripping is performed by discharging oxygen with fluorocarbon addition in a microwave or RF discharge zone. The radicals from the plasma are transported to a process chamber, where ions are typically left behind. In order to facilitate an acceptable reaction rate, the wafer may be heated up to 300° C. Material loss during downstream strip occurs by diffusion of radicals (O*) into silicon, which convert the silicon into silicon dioxide, where the high temperature increases the diffusion. Alternatively, if the direct low bias-potential plasma strip is used, material loss occurs due to charged chemical species (O+ or O2+) from the plasma penetrating through the thin dielectric layer into the active area.

In both types of dry strip the radials or ions react with the Si, Ge, or dopants, and basically incapacitate them. An example for such chemical species can be oxidizing radicals that are driven through the thin dielectric layer by sufficient thermal energy to react with or consume active area constituents. The active area constituents are oxidized or even removed during dry strip. Results of such an action lead to the loss of active area Si or Ge. Reducing species (i.e., hydrogen) can be equally as disruptive to cause material loss in the active areas, although this is not through oxidation. In addition, as an alternative to dry photoresist removal, wet processes have been developed using aqueous solutions of sulfuric acid and peroxide, for example, chemistry known as SHARK, purportedly causing minimum silicon loss. However, the technology is under development and does not work well when photoresist is hardened or a hard crust is formed when implanted at higher doses, as described above.

Thus, in FEOL post ion implant strip processing, Applicants have studied and developed processes for removing a hardened photoresist (PR) layer and the remaining bulk photoresist, without adversely affecting (or removing) any exposed dielectric layer over the underlying active area Silicon, which may or may not include N or P dopants and/or Ge. In addition to stringent material loss goals, it is required that the strip process not result in making a residue layer hard.

Embodiments of the present invention utilize a downstream plasma module having a plasma discharge section upstream of a reaction chamber. Embodiments of the invention use a novel process gas containing sulfur (S), oxygen (O), and hydrogen (H).

Figure 2:
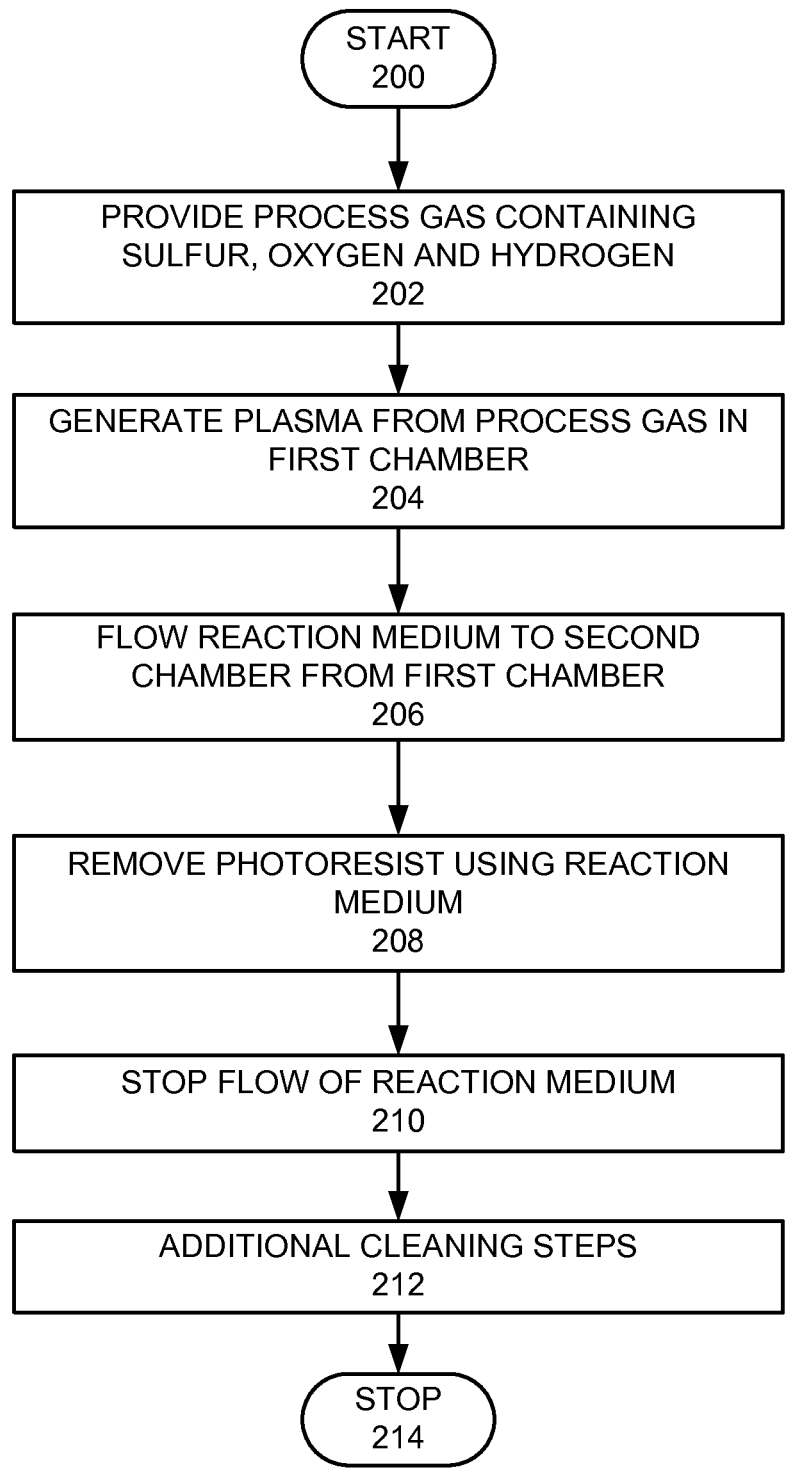
FIG. 2 is a high level flow chart of a process that may be used in an embodiment of the invention.

To facilitate understanding, FIG. 2 is a high level flow chart of a process that may be used to remove photoresist from a substrate in accordance with an embodiment of the present invention. The wafer has a patterned photoresist thereon. The photoresist may be used as an ion implantation mask prior to the photoresist removal, and may have a bulk portion and a crust portion covering the bulk portion, for example, as shown in FIG. 1A or 1B. However, it should be noted that the present invention is also applicable to other photoresist removal, for example, photoresist strip in the BEOL processes. Referring back to FIG. 2, a process gas containing sulfur (S), oxygen (O), and hydrogen (H) is provided (step 202). For example, the process gas may contain $SO_2$, $H_2O$ and $O_2$. The process gas may further contain fluorine containing gas, for example, $NF_6$, $NF_3$, or fluorocarbon, for example, $CF_4$. More generally, fluorocarbon may be expressed as $C_xF_y$ ($x \geq 1$, $y \geq 1$) and/or $C_xF_yH_z$ ($x \geq 1$, $y \geq 1$, $z \geq 1$). The source gas may further contain other component gases such as $H_2$ and $NH_3$.

A plasma is generated from the process gas in a first chamber (step 204). The plasma may be discharged using a microwave, an inductive discharge (RF energy), DC discharge, or some other high density dissociative remote source. A radical-rich ion-poor reaction medium is flown from the first chamber to a second chamber where the wafer is placed (step 206). The wafer has a patterned photoresist layer thereon. The patterned photoresist layer is removed using the reaction medium (step 208). Then, the flow of the reaction medium into the second chamber is stopped (step 210). Additional cleaning process(es) may be performed after the photoresist removal using the reaction medium (step 212).

Figure 3:
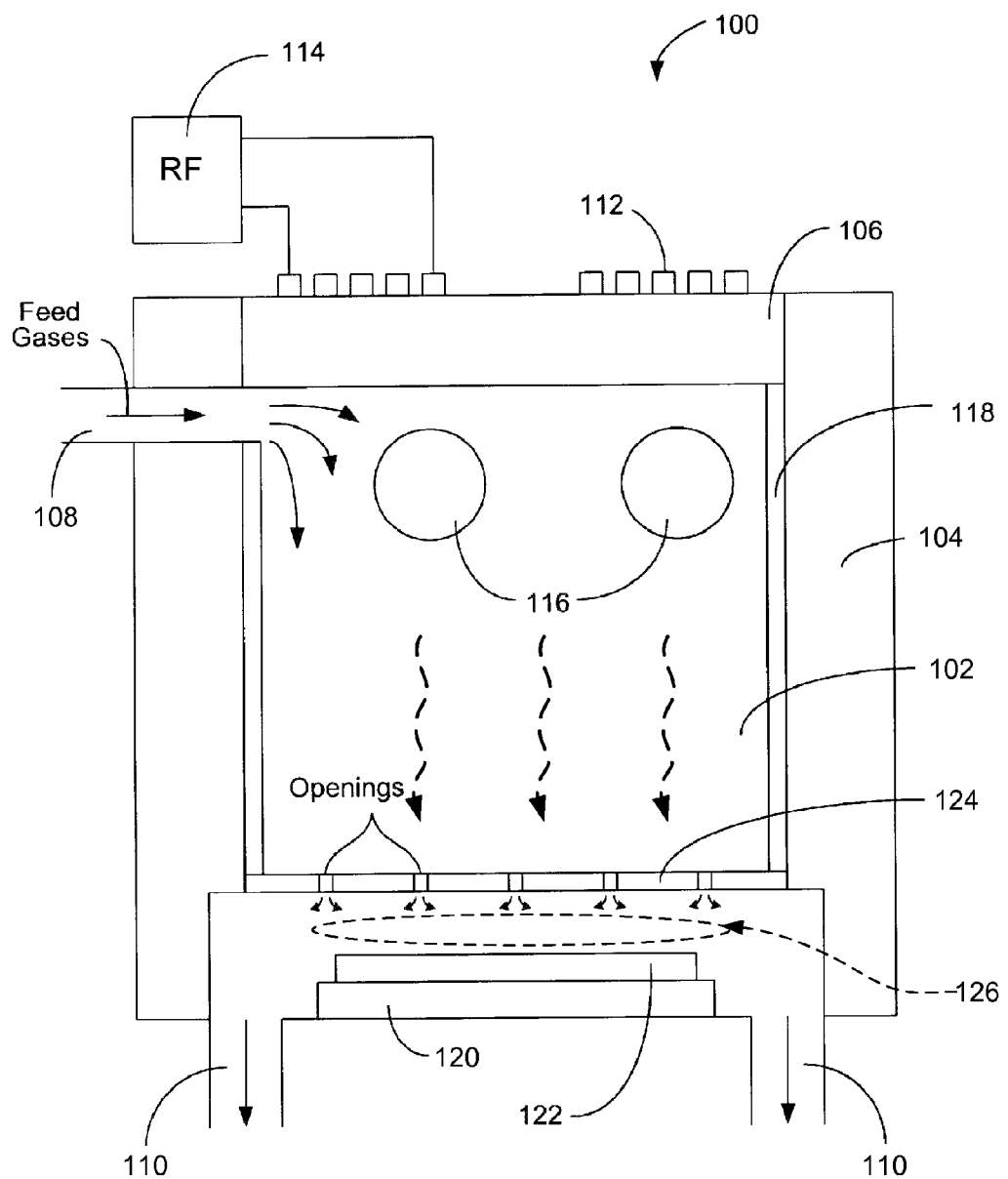
FIG. 3 is a schematic cross-sectional view of a plasma processing module which may be used for performing the photoresist removal in accordance with one embodiment of the present invention.

FIG. 3 is a schematic cross-sectional view of a plasma processing module 100 including a plasma chamber 102 which may be used for performing the photoresist removal in accordance with one embodiment of the present invention. The plasma chamber 102 includes chamber walls 104 and a dielectric window 106. The plasma processing module 100 includes a feed gas inlet 108 for allowing feed gases to flow into the chamber 102. An exhaust port 110 exhausts gases from the chamber 102. An inductive source 112, typically taking the form of a coil positioned on the dielectric window 106, is used to energize the feed gases within the chamber 102 and ignite a plasma within the chamber 102. In this example, the inductive source 112 is powered by an RF power supply 114.

The inductive source 112 causes the plasma within the chamber 102 to form a plasma having a primary dissociation zone 116. This primary dissociation 116 zone is the region within the chamber 102 that the plasma most efficiently dissociates the feed gases. In the case where the inductive source 112 takes the form of a coil attached to the dielectric window 106, the primary dissociation zone 116 takes the form of a generally donut shaped region located within the chamber 102 directly below the coils of the inductive source 112.

The plasma processing module 100 may also include a liner 118, such as a quartz liner, or any other available material, for protecting the walls of the plasma chamber from the plasma and reducing the recombination of neutral radicals like O or OH. A chuck 120 is positioned in the bottom of the chamber 102 and is configured to support a semiconductor substrate 122. As is known in the art, the chuck 120 may be heated to improve the efficiency of the process. The plasma processing module 100 also includes a quartz baffle 124 located above the substrate 122. The baffle 124 includes a plurality of openings formed through the baffle 124 which cause any gases flowing through the chamber 102 to be redistributed so that the gases flow more evenly over the substrate 122 than would be the case if the baffle 124 were not included in the plasma processing module 100. The baffle 124 partially shields the substrate 122 from direct exposure to the plasma. Thus, in this example, the plasma chamber 102 above the baffle 124 is considered as a first chamber, and a region below the baffle 124 where the substrate 122 is place on the chuck 120 is considered as a second chamber.

In accordance with one embodiment of the present invention, a novel gas combination containing sulfur (S), oxygen (O), and hydrogen (H), for example, a process gas containing feed gases: SO2, H2O and O2 is introduced via the feed gas inlet 108. One of the objectives of using H2O is to passivate active area silicon by "sealing" dangling Si bonds. The other objective is to generate relatively large (in contrast to the oxygen radical) powerful reagents which can attack the carbon within photoresist, but cannot readily diffuse into active area silicon. An optional fluorine containing gas may also be introduced into the discharge (dissociation zone 116) in the plasma chamber 102 via the feed gas inlet 108.

The process gas is dissociated in the primary dissociation zone 116 so as to form a radical-rich ion-poor reaction medium. In this specification and claims, "radical-rich ion-poor" means that the radical concentration (radicals/cm3) is greater than the ion density (ions/cm3) at least by the factor of E2 (102), preferably by the factor E5 (105) or greater, more preferably by the factor of E5 (105) to E8 (108), depending on the pressure, dissociation efficiency, and recombination rate. For example, the ion densities provided for the radical-rich ion-poor medium may be less than 10E7 (10×107) ions/cm3, preferably less than 10E6 (10×106) ions/cm3, while the range of radical concentrations may be 5E13 (5×1013) to 5E15 (5×1015) radicals/cm3, preferably 1E14 (1×1014) to 1E15 (1×1015) radicals/cm3. However, when the bias is applied, as described below, the ion density may be in the range of about 10E9 (10×109) to 10E10 (10×1010) ions/cm3. The radical-rich ion-poor reaction medium also includes a reaction medium in which substantially no ions are present. There are many reactions with the discharge products which will form a variety of strongly reactive species. Some of these compounds are strong reducing agents, some are very strong hydrogen donors, while others are oxidizing agents. By controlling the reactive mix it is possible to balance oxidation and reduction at the active area while effectively decomposing the photoresist. A plasma with SO2, H2O and O2 as feed gases will generate radicals: HSO4. monosulfate radical with properties of sulfuric acid, HSO3. bisulfite radical, HO. hydroxyl radical; and O. oxygen radical. The HSO4. and HSO3. radicals are strong hydrogen donors such that it can hydrogenate the carbon in the photoresist. Additionally the HSO4. radical is a strong oxidizing compound such that it along with HO. and O. oxidize the weakened carbon. It should be noted that SO2, not other oxides of sulfur, needs to be present with H2O in order to facilitate the appropriate reaction.

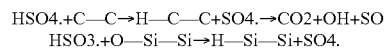

HSO4.+C—C→H—C—C+SO4.→CO2+OH+SO
HSO3.+O—Si—Si→H—Si—Si+SO4.

The radical-rich ion-poor reaction medium is flown from the primary dissociation zone 116 of the plasma chamber 102 through the baffle 124 to the reaction zone 126 where the substrate 122 is placed, as shown in FIG. 3. Since the baffle 124 partially shields ions from reaching the substrate, the reaction zone 126 can be considered as a second chamber in this example. The patterned photoresist layer on the substrate 122 is removed using the reaction medium.

Figure 4A:
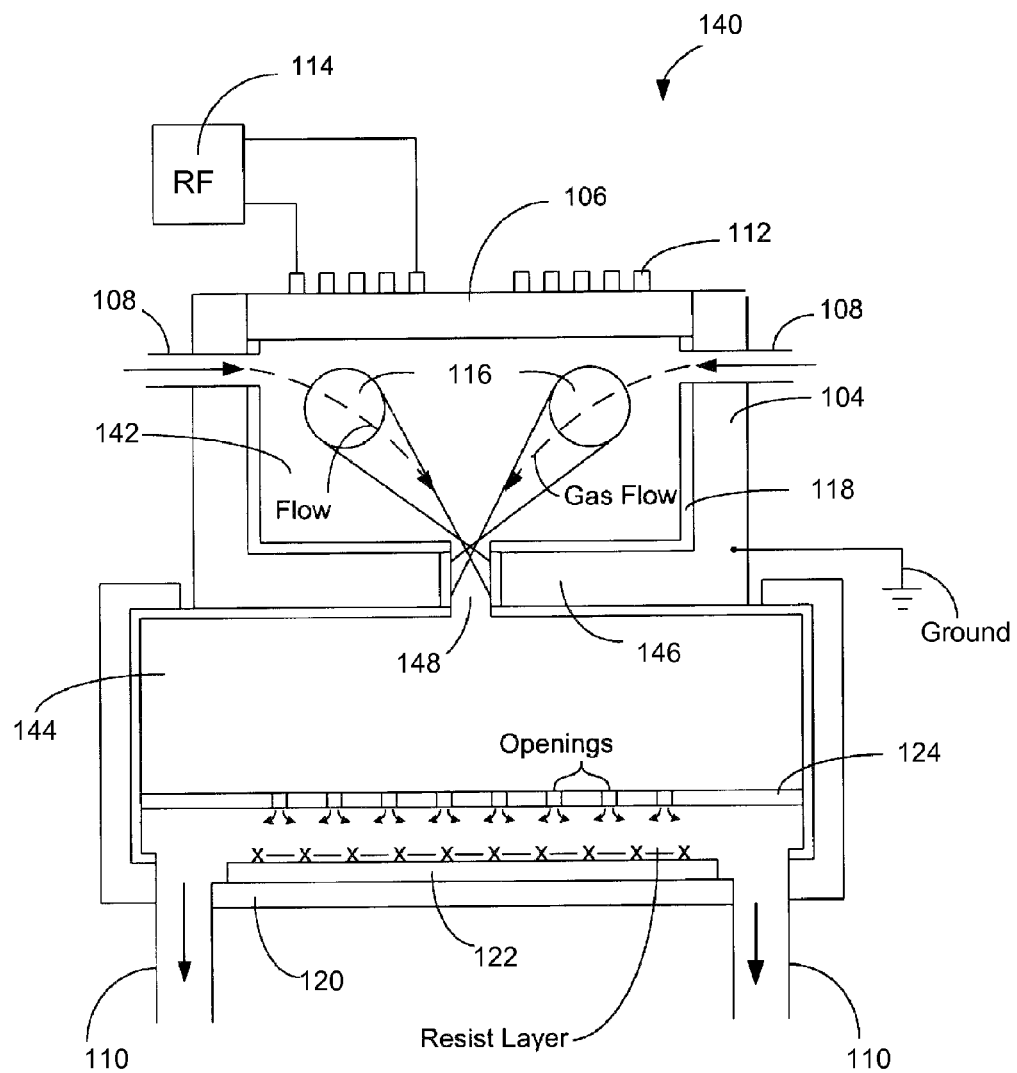
FIGS. 4A and 4B schematically illustrate examples of a downstream, inductively coupled plasma processing module which may be used for performing photoresist removal in accordance with another embodiment of the present invention.

FIG. 4A schematically illustrates a downstream, inductively coupled plasma processing module 140 which may be used for performing photoresist removal, in accordance with another embodiment of the present invention. For illustrative purposes, like reference numerals will be used throughout the various figures for like components such that those of ordinary skill in the art understand the similar components and functions thereof without additional explanation.

Generally, the plasma processing module 140 is similar to the plasma processing module 100 described above, except that the plasma chamber 102 is divided into a first (upper) chamber 142 for plasma generation and dissociation, and a second (lower) chamber 144 for processing (photoresist removal), by a plasma containment plate 146, as shown in FIG. 4A.

Similarly to the plasma processing module 100, the plasma processing module 140 includes feed gas inlet 108 for allowing feed gases to flow into the first chamber 142. Exhaust ports 110 exhausts gases from the second chamber 144. Inductive source 112, in this case taking the form of a coil positioned above the dielectric window 106, is used to energize feed gases within the first chamber 142 and generate a plasma within the first chamber 142 from the feed gases. In this example, the inductive source 112 is powered by RF power supply 114 which takes the form of a transformer coupled source. Typical inductive source power ranges from about 250 W to about 5000 W or more. Similarly to the previous embodiment, the specific configuration and shape of inductive source 112 causes a plasma having primary dissociation zone 116 in the first chamber 142. During plasma processing, the gas pressure within the first chamber 142 and the second chamber 144 may be from about 10 mT to about 10 T or more, but typically the operating pressure is about 1 T. The feed gas flow may range from about 100 standard cubic centimeters per minute (sccm) to about 10,000 sccm or more for a 300 mm substrate (wafer).

An internal port 148 that interconnects the first chamber 142 and the second chamber 144 is provided substantially at the center of the plasma containing plate 146. The internal port 148 allows the reaction medium generated in the first chamber 142 to flow into the second chamber 144 during the processing of the substrate 122. The second chamber 144 may have a baffle 124. The reaction zone (not shown in FIG. 4) below the baffle 124 may be considered as part of the second chamber, or alternatively, a third chamber.

As shown in FIG. 4A, the feed gas inlet 108 may be located such that the flow of any feed gases fed into the first chamber 142 is directed substantially through the primary dissociation zone 116 toward the internal port 148 as indicated by the arrows. The plasma generated in the first chamber 142 produces a reaction medium from the feed gases, and the reaction medium is transported from the first chamber to the second chamber via the internal port 148. In this embodiment, the feed gases may be SO2, H2O and O2 which are introduced via the gas feed inlet 108. The optional fluorine containing gas may also be provided through the gas feed inlet 108.

Additionally, the chamber walls 104 and the plasma confinement plate 146 may be grounded. This grounding of the walls attracts any charged species causing them to collide with the walls thereby helping to prevent the charged species (ions) from flowing from the first chamber 142 into the second chamber 144.

The reaction medium introduced into the second chamber 144 is thus further radical-rich ion-poor, and preferably in accordance with an embodiment of the present invention, the reaction medium contains substantially no ions or charged particles.

As shown in FIG. 4A, the second chamber 144 has a quartz baffle 124 located above the substrate 122. The baffle 124 includes openings formed through baffle 124 which cause the reaction medium flowing through the second chamber 144 to be redistributed more evenly over the substrate 122 than would be the case without the baffle 124.

Figure 4B:
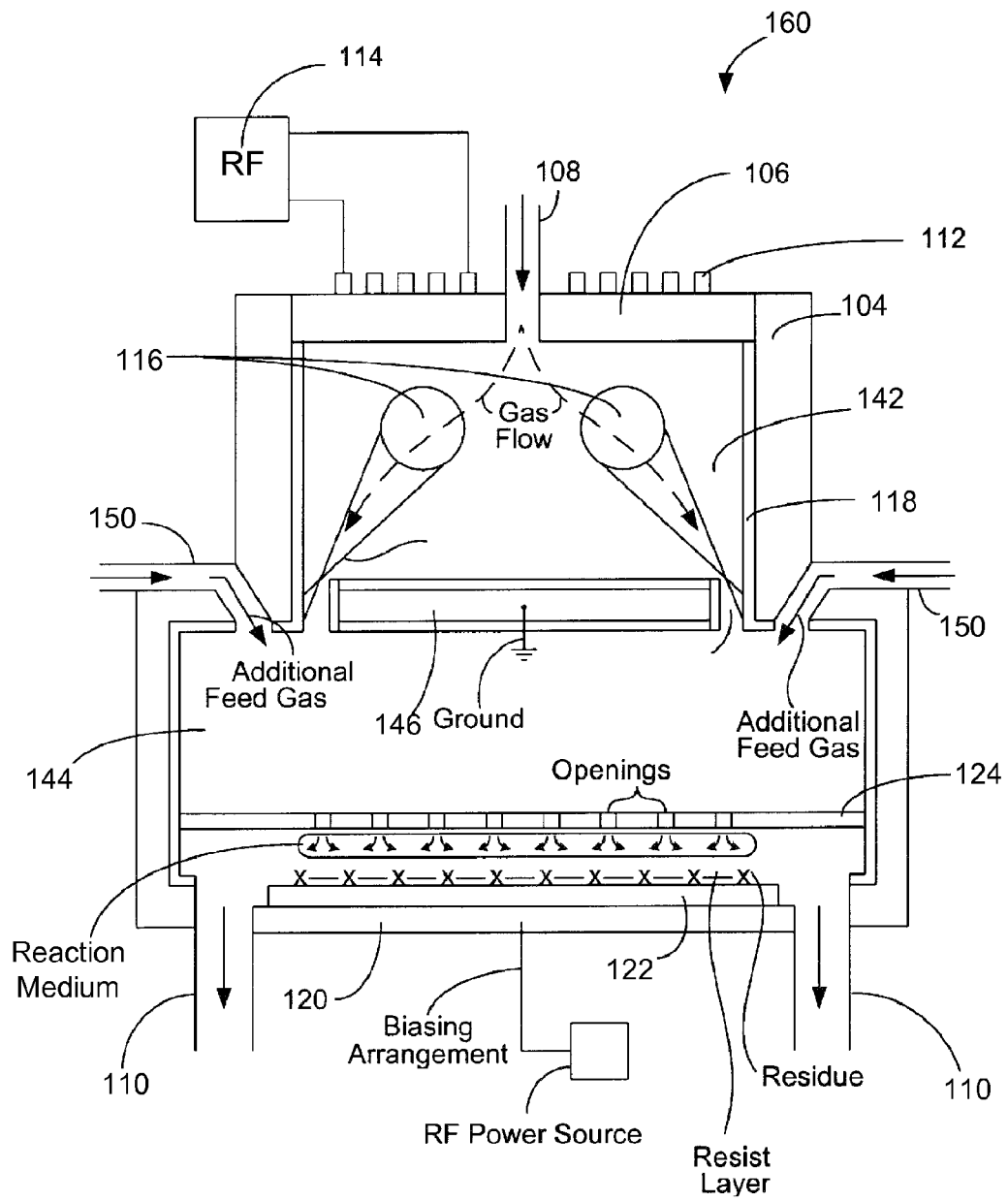

In accordance with another embodiment of the present invention, some feed gases are injected into the plasma discharge (dissociation zone 116), while other gases may be injected downstream of the discharge. FIG. 4B schematically illustrates another example of plasma processing module 160 similar to the plasma processing module 140, in which configuration of the feed gas inlet 108 and the internal port 148 is different, and an additional injection port 150 is provided to the second chamber 144. In this example, the feed gas inlet 108 is provided at substantially the center of the top of the first chamber 142, and the internal port 148 is provided at the both sides (or periphery) of the plasma containment plate 146. The additional injection port 150 is provided on the top wall of the second chamber 144. In this example, all of the feed gases may be provided through the feed gas inlet 108. Alternatively, the fluorine containing gas may be introduced downstream of the plasma into the second chamber 144 via the additional injection port 150. Other features are similar to those of the plasma processing module 140 described above.

Figure 5:
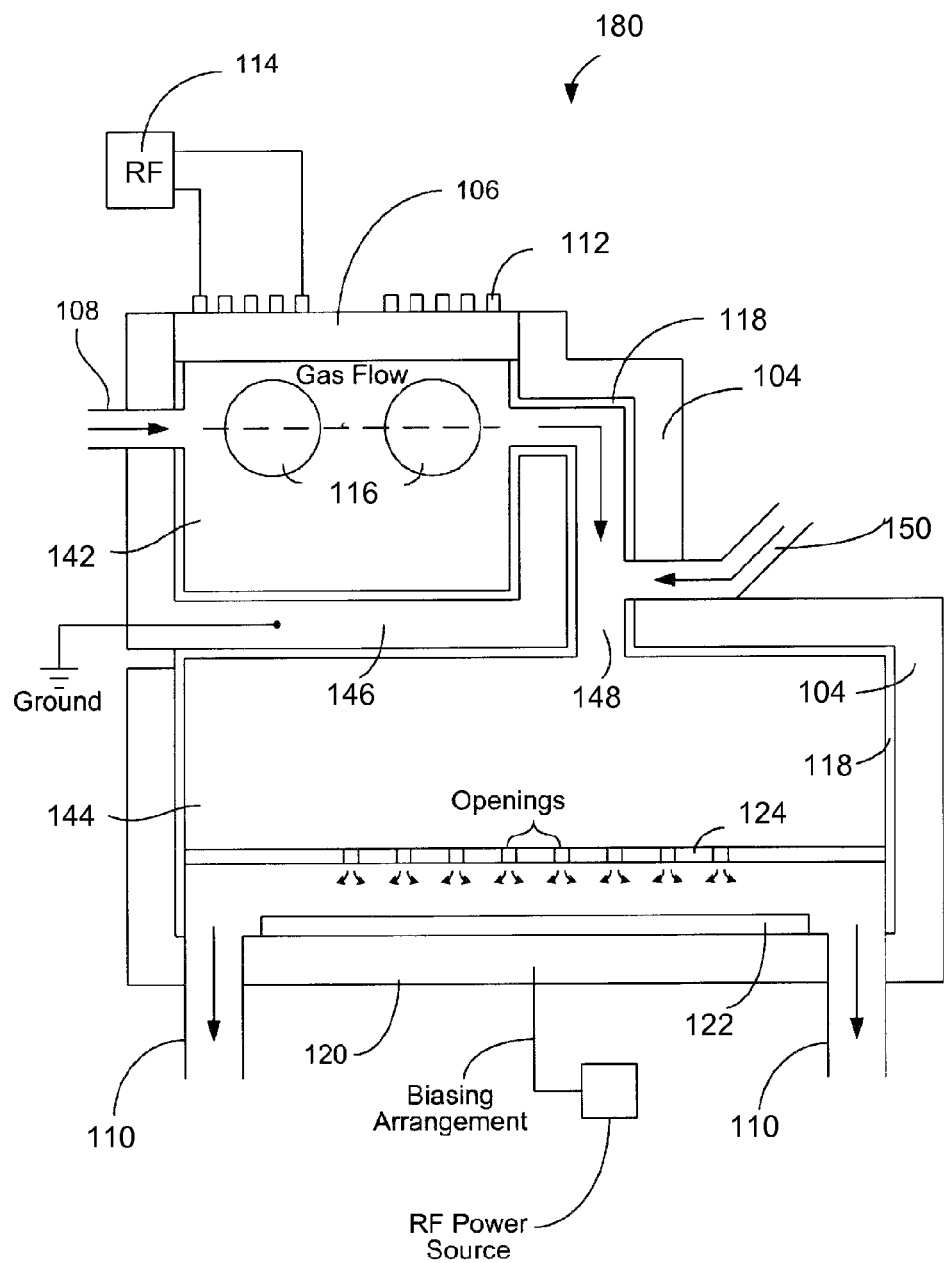
FIG. 5 schematically illustrates another example of a downstream, inductively coupled plasma processing module which may be used for performing photoresist removal in accordance with yet another embodiment of the present invention.

FIG. 5 schematically illustrates another example of a downstream, inductively coupled plasma processing module 180 which may be used for performing photoresist removal, in accordance with another embodiment of the present invention. For illustrative purposes, like reference numerals will be used throughout the various figures for like components such that those of ordinary skill in the art understand the similar components and functions thereof without additional explanation.

Generally, the plasma processing module 180 is similar to the plasma processing modules 140 and 160 described above, except that the internal port 148 extends downward from an upper part of the first chamber 142 to the second chamber 144 so as to have an opening on the top wall of the second chamber 144.

As shown in FIG. 5, the feed gas inlet 108 and the internal port 148 are provided to the first chamber 142 such that the flow of any feed gases fed into the first chamber 142 passes substantially through the primary dissociation zone 116 to the internal port 148. For example, the opening of the gas feed inlet 108 and the exit to the internal port 148 may be located on the opposite side of the first chamber 142 across the primary dissociation zone 116. Furthermore, as shown in FIG. 5, the plasma processing module 180 further includes an injection port 150 connected to the passageway of the internal port 148 between an exit from the first chamber 142 and an opening to the second chamber 144.

The plasma generated in the first chamber 142 produces a reaction medium from the feed gases, and the reaction medium is transported from the first chamber 142 to the second chamber 144 via the internal port 148. In this embodiment, the feed gases may be SO2, H2O and O2 which are introduced via the gas feed inlet 108. The optional fluorine containing gas or gases may be provided downstream by introducing through the injection port 150 into the reaction medium which is being transported from the first chamber 142 to the second chamber 144. It should be noted that the injection port 150 may also be used to inject water vapor for salvation as described below with respect to other embodiments of the present invention.

Additionally, the chamber walls 104 and the plasma confinement plate 146 which also constitute walls of the internal port 148 may be grounded. This grounding of the walls attracts any charged species causing them to collide with the walls thereby helping to prevent the charged species (ions) from flowing from the first chamber 142 into the second chamber 144.

Figure 6:
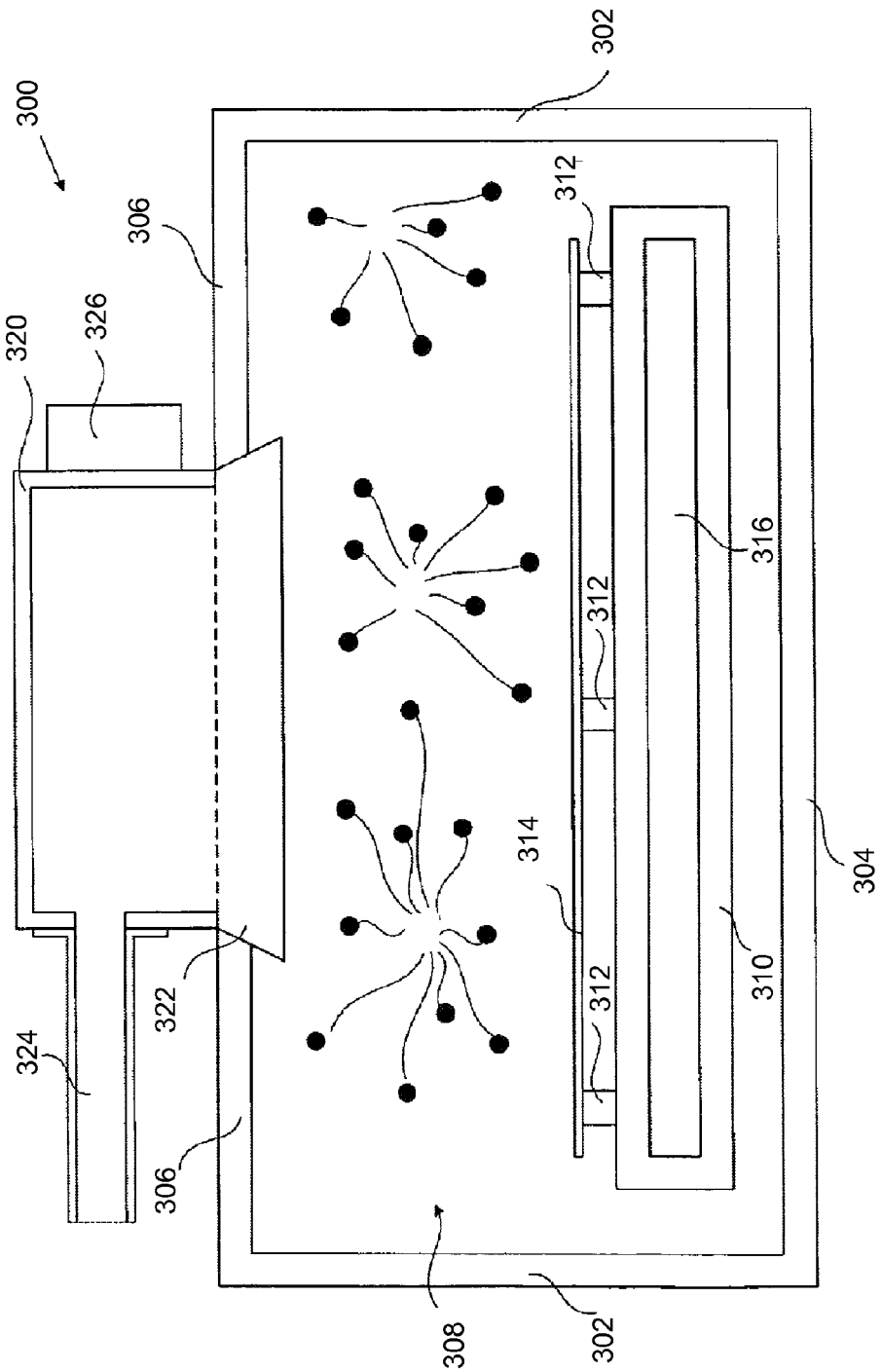
FIG. 6 schematically illustrates a downstream photoresist stripping chamber ("downstream chamber") which may be used for performing photoresist removal in accordance with yet another embodiment of the present invention.

The present invention can also be performed using a microwave powered downstream plasma process chamber. FIG. 6 schematically illustrates a downstream photoresist stripping chamber ("downstream chamber") 300 in accordance with one embodiment of the present invention. The downstream chamber 300 includes chamber walls 302, a chamber bottom 304, and a chamber top 306, which define a chamber internal region 308. A semiconductor wafer support structure (or "chuck") 310 is positioned within the chamber internal region 308 near the chamber bottom 304. The chuck 310 may contain a number of lifting pins 312 that are used to raise and lower a semiconductor wafer (or "wafer") 314 placed on the chuck 310 for processing. The chuck 310 may also include a heater 316 configured to operate using electric power. The downstream chamber 300 also includes exhaust system (not shown).

The downstream chamber 300 further includes an applicator tube 320 positioned above the chamber top 306. The applicator tube 320 is configured to be in open communication with the chamber internal region 308 via a shower head 322. A processing gas supply line 324 is in fluid communication with the applicator tube 320 to supply a processing gas. The purpose of the applicator tube 320 is to couple microwave energy to the feed gas and to deliver the dissociated reactive gas mixture to the processing chamber 300. The shape of the applicator tube 320 is not limited to that illustrated in FIG. 6, and the applicator tube may have a different shape such as an elongate tube with an opening at the end. In the embodiment of the present invention, the preferred processing gas contains sulfur (S), oxygen (O), and hydrogen (H). For example, the process gas contains SO2, H2O and O2 as feed gases. The process gas may further contain fluorine containing gas, for example, NF6, NF3, or fluorocarbon, for example, CF4. More generally, fluorocarbon may be expressed as CxFy (x≥1, y≥1) and/or CxFyHz (x≥1, y≥1, z≥1). However, the processing gas supply line 324 can be configured to supply virtually any type of processing gas.

A microwave power supply 326 is also connected to the applicator tube 320 to supply microwave power to the processing gas within the applicator tube 320. The microwave power generates a plasma and transforms the processing gas into a reaction medium containing radicals as its constituent elements. Thus, the applicator tube 320 functions as a first chamber for generating the reaction medium via plasma. In accordance with one embodiment of the present invention, a plasma with SO2, H2O and O2 feed gases will generate radicals: HSO4. monosulfate radical with properties of sulfuric acid, HSO3. bislufite radical, HO. hydroxyl radical; and O. oxygen radical. The radicals include primarily H radicals and O radicals. The radicals flow through the shower head 322 into the chamber internal region 308 toward the wafer 314. The radicals isotropically (i.e., uniformly in direction) contact the wafer 314 and react to remove materials present on the surface of the wafer 314. The HSO4. and HSO3. radicals are strong hydrogen donors such that it can hydrogenate the carbon in the photoresist. Additionally the HSO4. radical is a strong oxidizing compound such that it along with HO. and O. oxidize the weakened carbon.

Figure 7A:
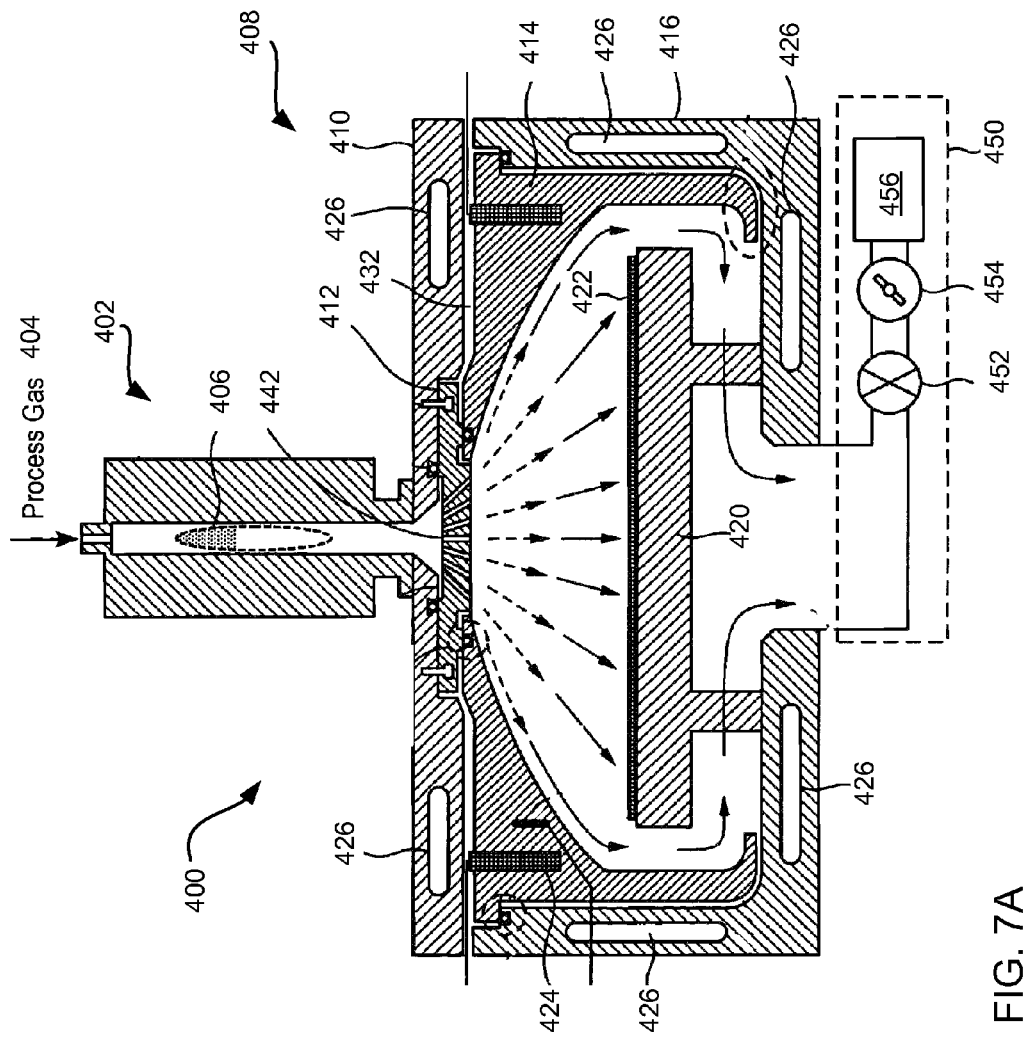
FIGS. 7A-7C schematically illustrate other examples of a plasma module (stripper module) having temperature control which may be used for performing photoresist removal in accordance with one embodiment of the present invention.

FIG. 7A schematically illustrates another example of a plasma module (stripper module) 400 having temperature control in accordance with one embodiment of the present invention. The stripper module 400 includes a plasma source (with a plasma chamber) 402 and a process chamber 408. The plasma source 402 energizes a process gas 404 into plasma 406, for example, using a microwave or RF-powered source. The process chamber 408 includes a chamber top 410 having a central opening, a gas distribution component 412 secured to the chamber top 410 at the central opening, an internal chamber body 414, a temperature controlled chuck 420 for supporting a substrate (wafer) 422 thereon, and an external chamber body 416 that slidably mounts the internal chamber body 414 thereon and surrounds the side of the internal chamber body 414. The stripper module 400 also includes an exhaust unit 450 coupled thereto. The exhaust unit 450 may include an isolation valve 452 and a throttle valve 454 coupled to a vacuum pump 456. The plasma module 400 may also include one or more heaters 424 and fluid cooling channels 426.

The inlet of the central opening of the chamber top 410 is aligned with the outlet of the plasma source 402. The gas distribution component 412 has a plurality of gas passages 442 formed therein, which are configured such that the gas exiting from the gas passages is dispersed and uniformly fanned out. The outlet of the central opening is in fluid communication with the inlets of the gas passages 442. The internal chamber body 414 is positioned beneath the gas distribution component 412 and includes an upper chamber dome that has a streamlined inner surface to reduce flow recirculation and turbulence and including a side portion that surrounds the substrate 422 and chuck (support) 420 in the circumferential direction of the chuck 420. However, the present invention is not limited to those specific configurations of the chamber.

A plasma is generated in the plasma source (chamber) 402 from the process gas containing sulfur (S), oxygen (O), and hydrogen (H), for example, a process gas containing feed gases of SO2, H2O and O2, and an optional fluorine containing gas. A radical-rich ion-poor reaction medium flows downstream from the plasma 406 into the internal chamber body 414 of the process chamber 408 through the central opening and the gas distribution component 412.

Figure 7B:
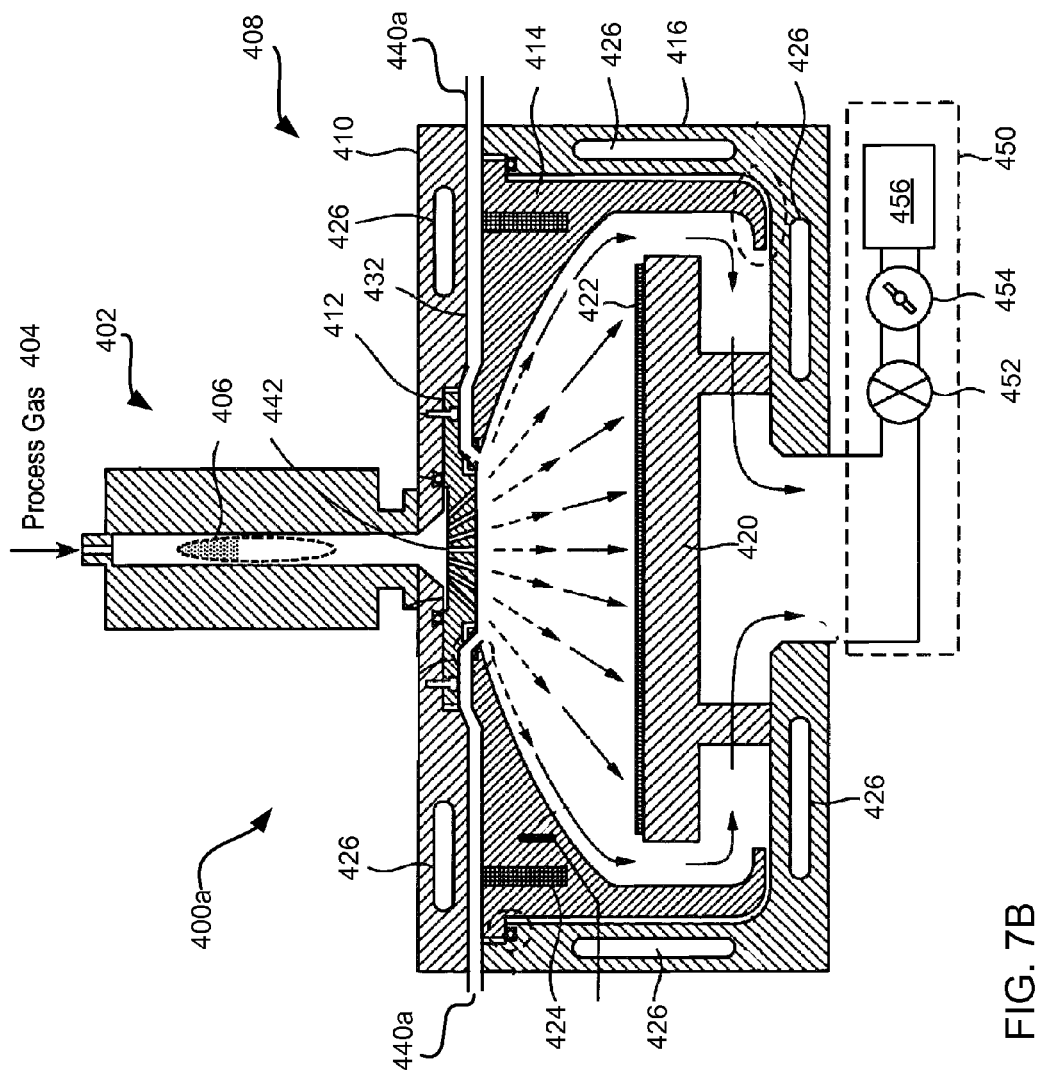
Figure 7C:
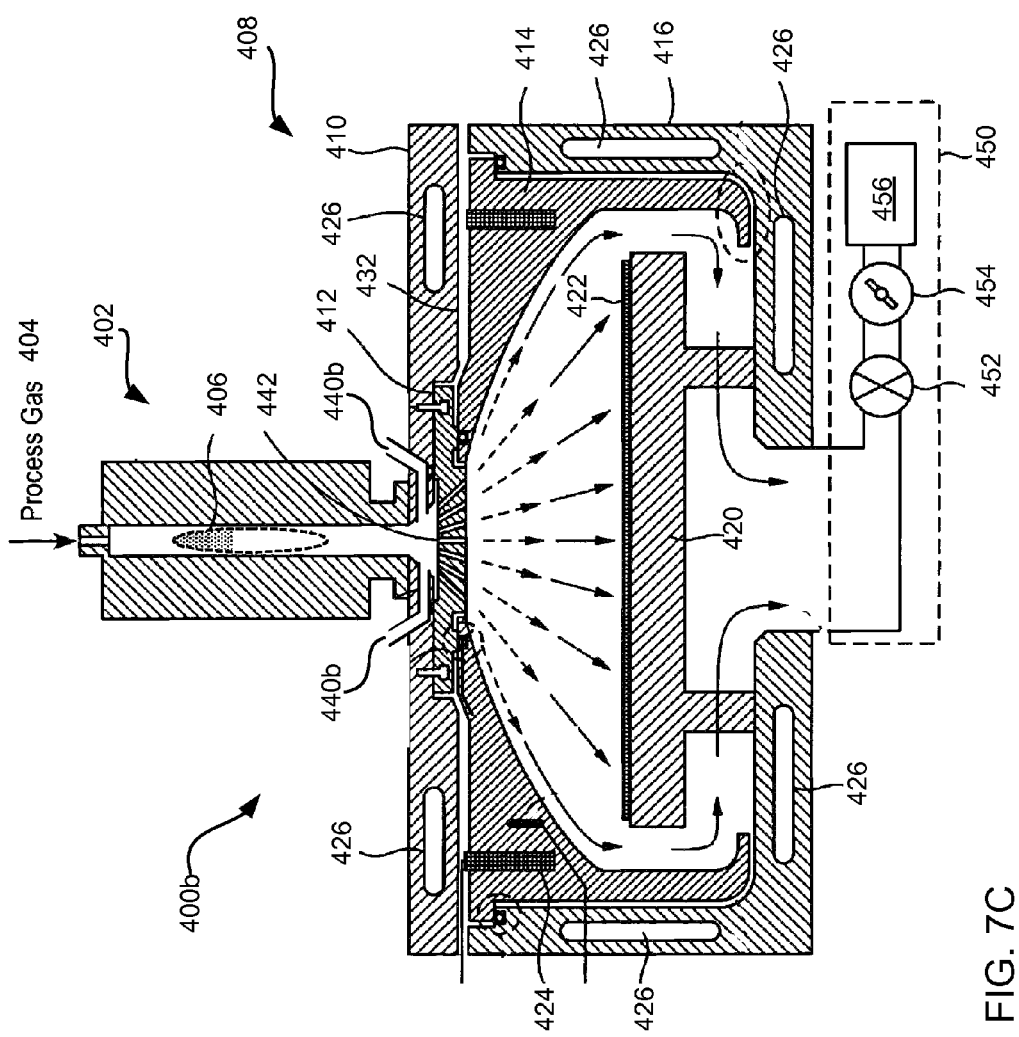

In addition, an additional gas injection port 440a may be provided, for example, through a gap 432 between the internal chamber body 414 and the chamber top 410, as shown in FIG. 7B. In this case, the optional fluorine containing gas may be introduced through the gas injection port 440a into the internal chamber body downstream the gas passages from the gas distribution component 412. Alternatively, as shown in FIG. 7C the additional gas injection port 440b may be provided downstream the plasma source 402 at the conical section above the gas distribution component 412, so as to inject the additional gas containing fluorine.

Figure 8:
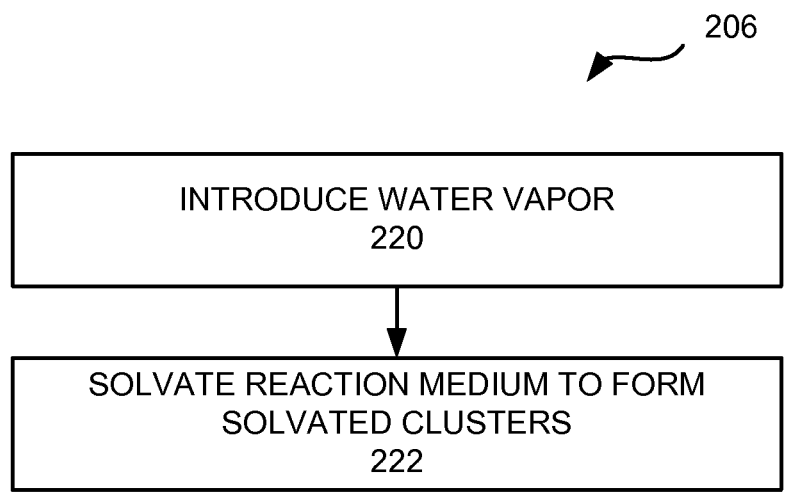
FIG. 8 is a flow chart of the solvation process of the reaction medium being transported from the plasma to the wafer in accordance with one embodiment of the present invention.

In accordance with one embodiment of the present invention, the method for removing the photoresist further includes solvating the reaction medium before reaching the plasma. To facilitate understanding, FIG. 8 is a flow chart of the solvation process of the reaction medium being transported from the plasma to the wafer (during the step 206 in FIG. 2). As shown in FIG. 8, water vapor is introduced in an injection or solvation zone that is provided in a passage of the reaction medium flowing down from the plasma or the plasma source toward the wafer (step 220). The water is forced through a nozzle or orifice to ensure mild condensation as clusters around ions or radicals.

The water vapor solvates the reaction medium to form solvated clusters of species (step 222) before the reaction medium reaches the wafer. The means to achieve clustering (or solvation) is by injecting the water vapor through a fine orifice such that small amount of condensation occurs. This would be condensation around the specific molecule or ion. This downstream injection is operated such that the water vapor entering into the flowing reaction medium (discharge stream) is allowed to condense around species of the reaction medium generated in the plasma to form solvated clusters. These solvated clusters include either an active radical or ion surrounded by a number of water molecules. The number of the water molecules may range from 3 to roughly 20, more generally, 2 to 100.

In this specification and claims, when the radicals are solvated, it means that clusters of water molecules are formed around active radicals, and the zone where the water vapor is injected and the radicals are solvated is referred to as a solvation zone. As the radicals are transported to the wafer, the reaction on the surface of the photoresist is microscopically aqueous. The formation of the clusters depends on the pressure differential between the gas feed line and the injection zone, as well as on the orifice size. A controller is configured to control a pressure differential between the gas feed line of the water vapor and the salvation zone where the water vapor is injected. The radicals are solvated as:

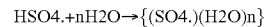

The number n may be in the range of 2 to 100 when the mild condensation occurs.

If the number of solvating water molecules is large enough, a single neutrally charged cluster can deliver both positive and negative ions:

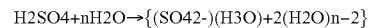

Figure 9:
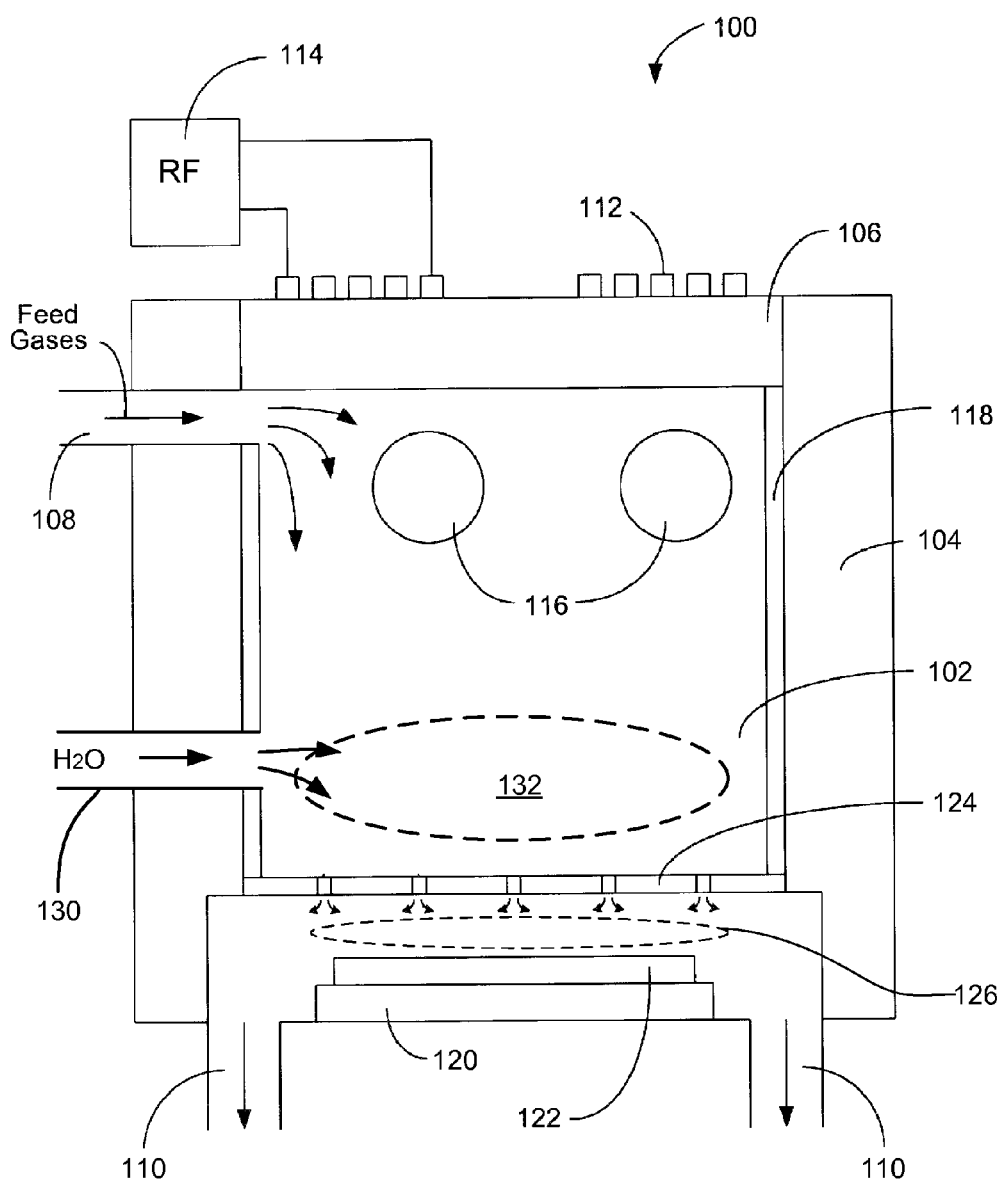
FIG. 9 schematically illustrates an example of the plasma processing module having an additional water vapor inlet in accordance with one embodiment of the present invention.

In accordance with one embodiment of the present invention, the solvation zone is provided in the first chamber downstream of the plasma such that the reaction medium is solvated before the reaction medium enters into the second chamber. For example, as shown in FIG. 9, an additional water vapor inlet 130 may be provided to the plasma processing module 100 (FIG. 3) so as to inject water vapor. The reaction medium is solvated in a solvation zone 132. The solvation zone in this embodiment is in close proximity to the plasma generation zone. This ensures maximum interaction of the water with the plasma. It should be noted that if the solvation zone is too close to the plasma, it may result in dissociation of water molecules and breaking of the clusters, and thus the proximity should be well controlled.

Figure 10:
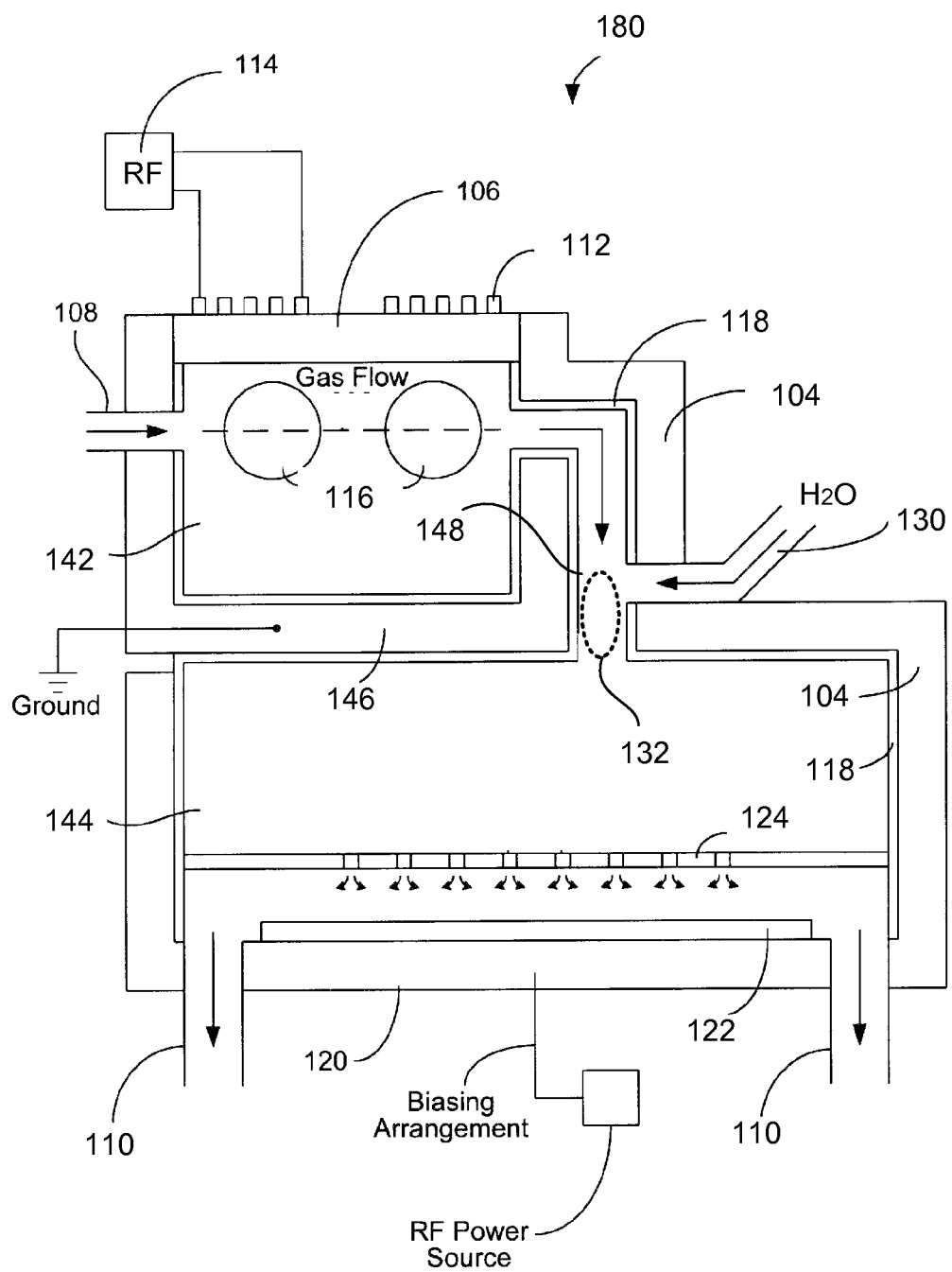
FIG. 10 schematically illustrates another example of the plasma processing module in which the injection port is used as an additional water vapor inlet in accordance with one embodiment of the present invention.

In accordance with another embodiment of the present invention, the solvation zone is provided in a passage of the reaction medium between the first chamber and the second chamber. For example, as shown in FIG. 10, the injection port 150 in the plasma processing module 180 (FIG. 5) can be used as an additional water vapor inlet 130 to inject water vapor. The reaction medium is solvated in the internal port 148. The solvation process may continue while the reaction medium is transported into the second chamber 144. The solvation zone is removed from the plasma generation zone to prevent the water vapor from being dissociated and prevent the clusters from breaking up.

Figure 11A:
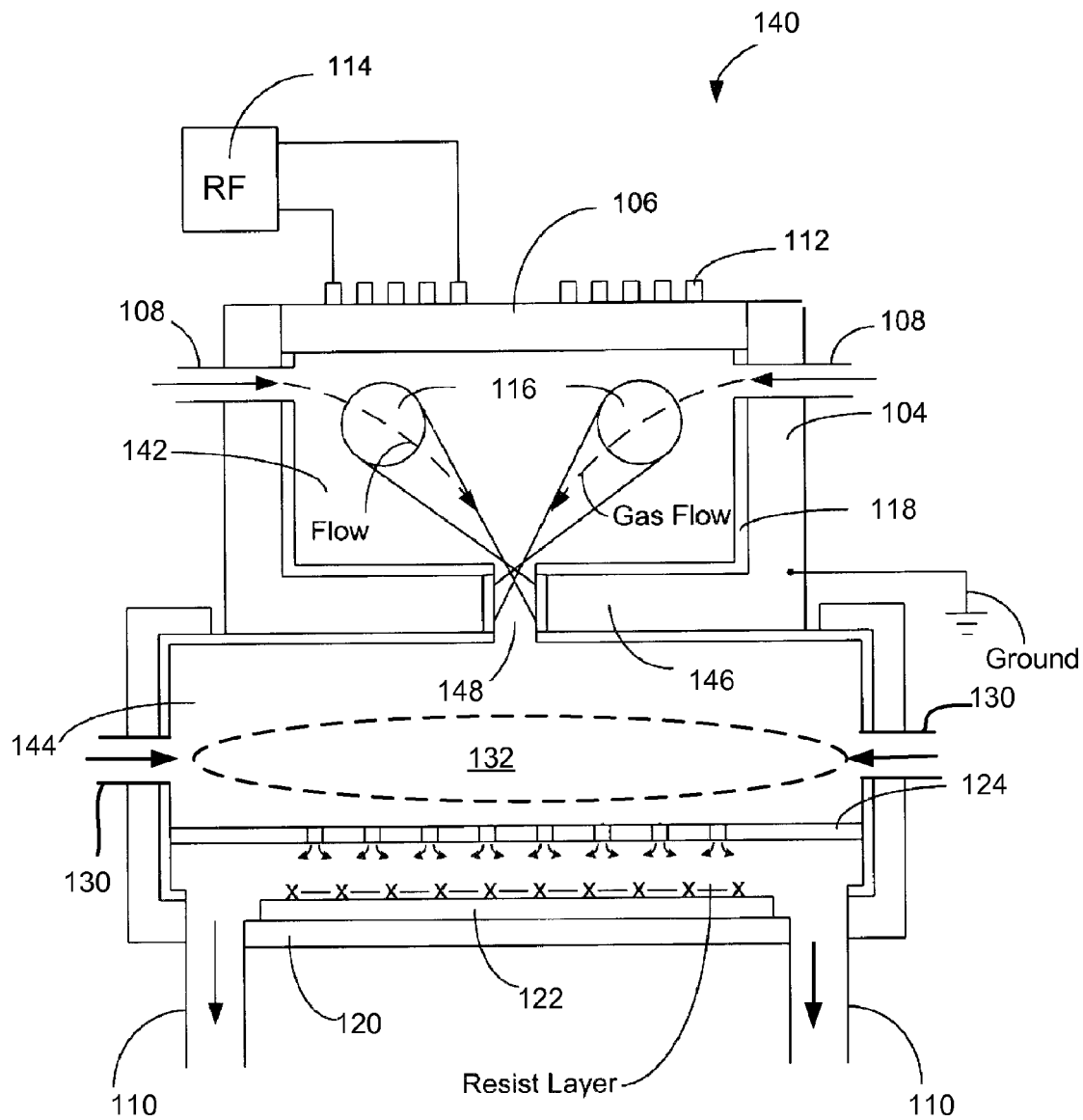
FIGS. 11A-12 schematically illustrates other examples of plasma processing modules having a water vapor inlet in accordance with embodiments of the present invention.
Figure 11B:
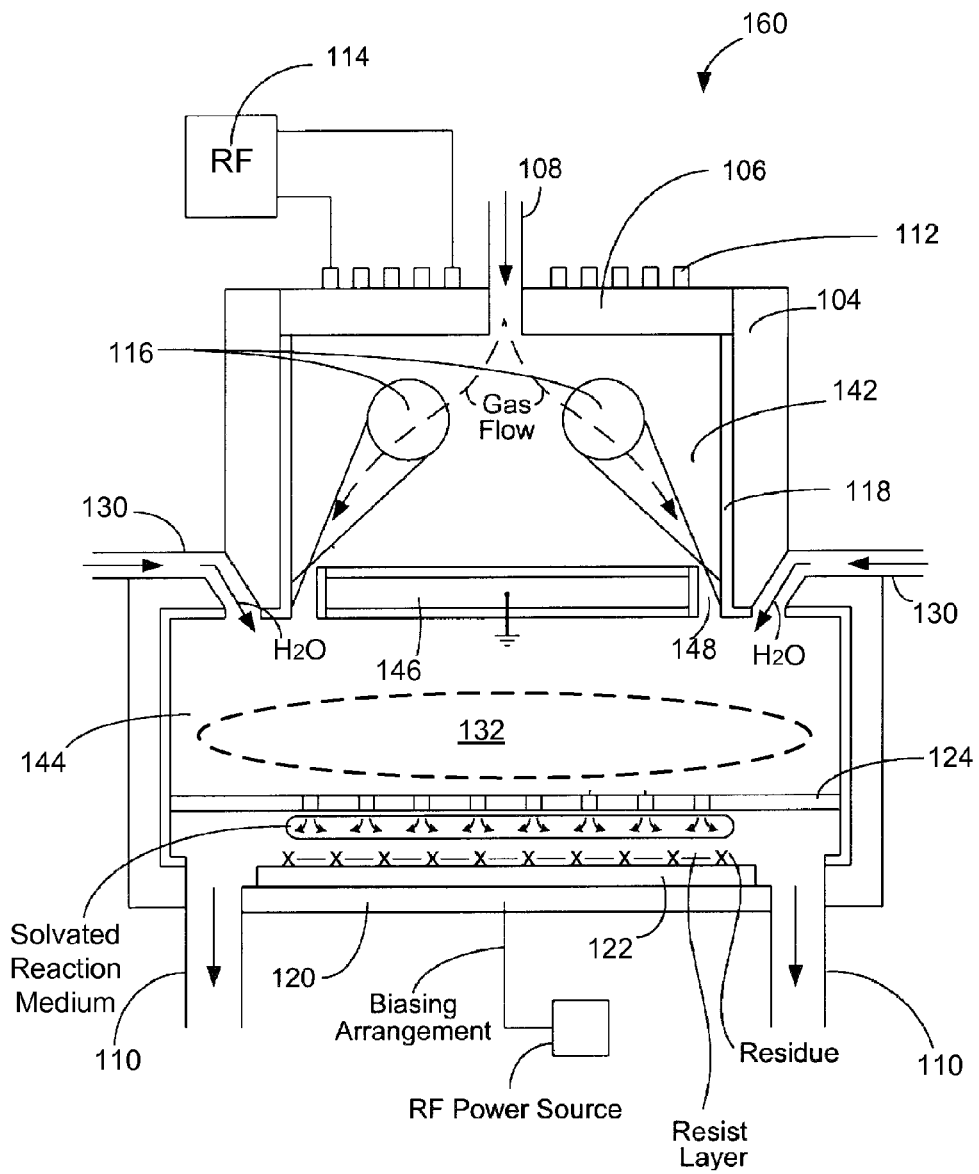
Figure 12:
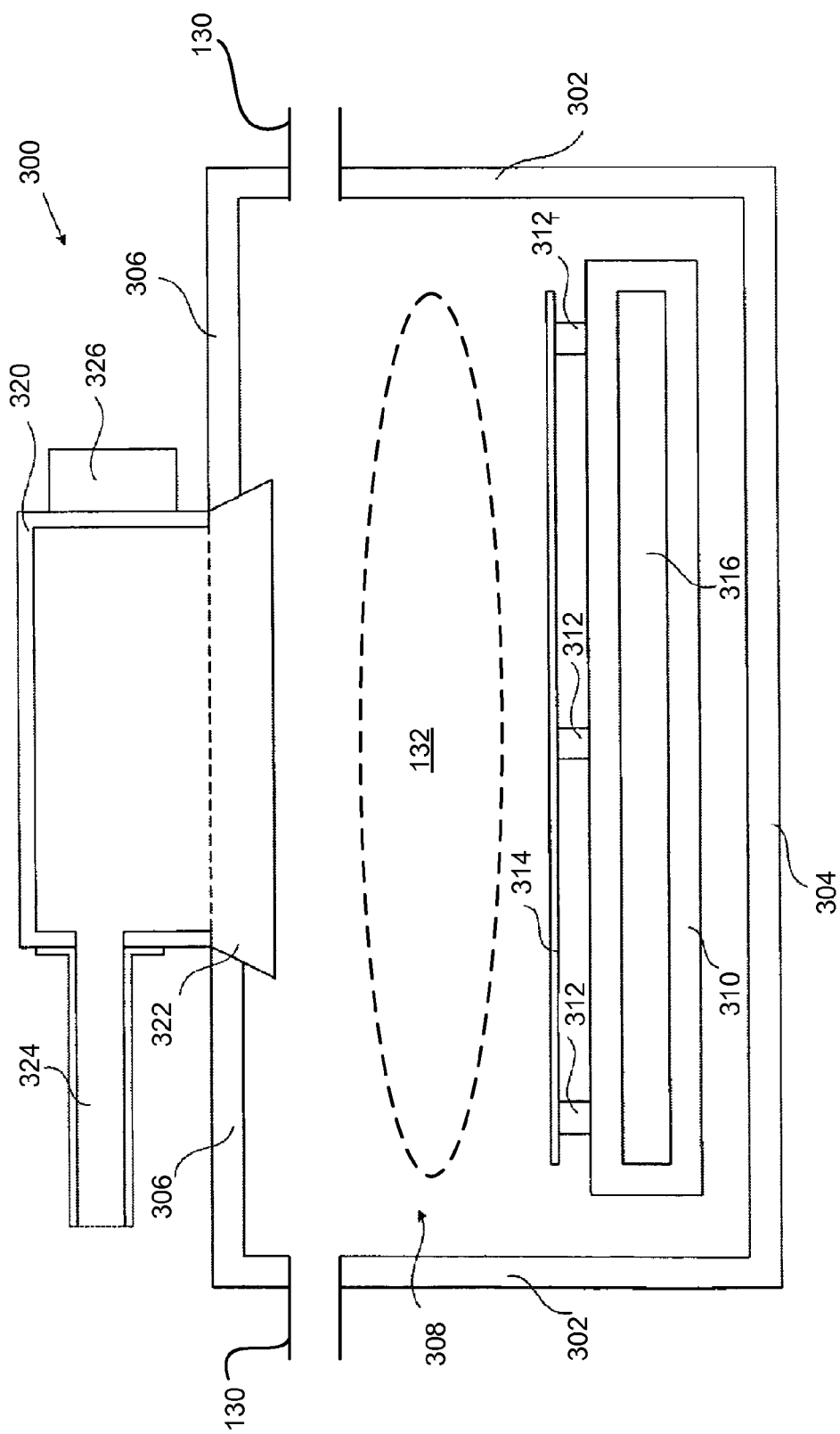

In accordance with yet another embodiment of the present invention, the solvation zone is provided in the second chamber such that the reaction medium is solvated before the reaction medium reaches the wafer. For example, as shown in FIG. 11A, an additional water vapor inlet 130 may be provided to the plasma processing module 140 (FIG. 4A) so as to inject water vapor. Alternatively, as shown in FIG. 11B, the additional injection port 150 in the plasma processing module 160 (FIG. 4B), can be used as an additional water vapor inlet 130 to inject water vapor. In addition, as shown in FIG. 12, an additional water inlet 130 may be provided to a downstream chamber 300 (FIG. 6) so as to provide a solvation zone 132. The reaction medium is solvated in the solvation zone 132 in each of these examples. These configurations place the solvation zone further down stream from the plasma source ensuring complete clustering without interference from the plasma, since the plasma may breakup the clusters and even dissociate the water if the solvation zone is too close to the plasma.

Figure 13:
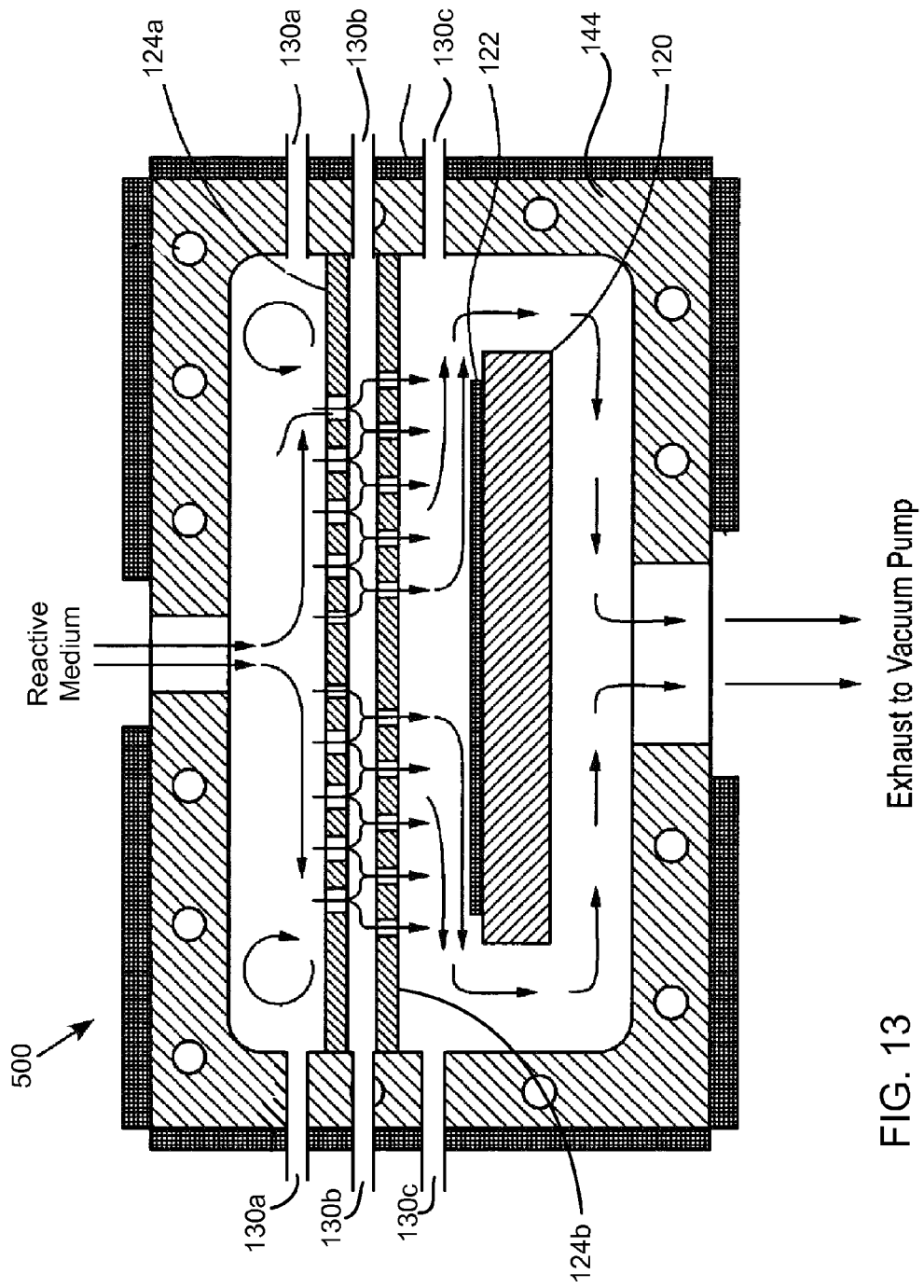
FIG. 13 schematically illustrates an example in which the second chamber of the plasma module includes more than one baffles (gas distribution components).

FIG. 13 schematically illustrates an example in which the second chamber 144 of the plasma module 500 includes more than one baffles (gas distribution components). The additional water vapor inlet may be provided either above the upper baffle 124a (water vapor inlet 130a), between two baffles 124a and 124b (water vapor inlet 130b), or below the lower baffle 124b (water vapor inlet 130c).

Figure 14A:
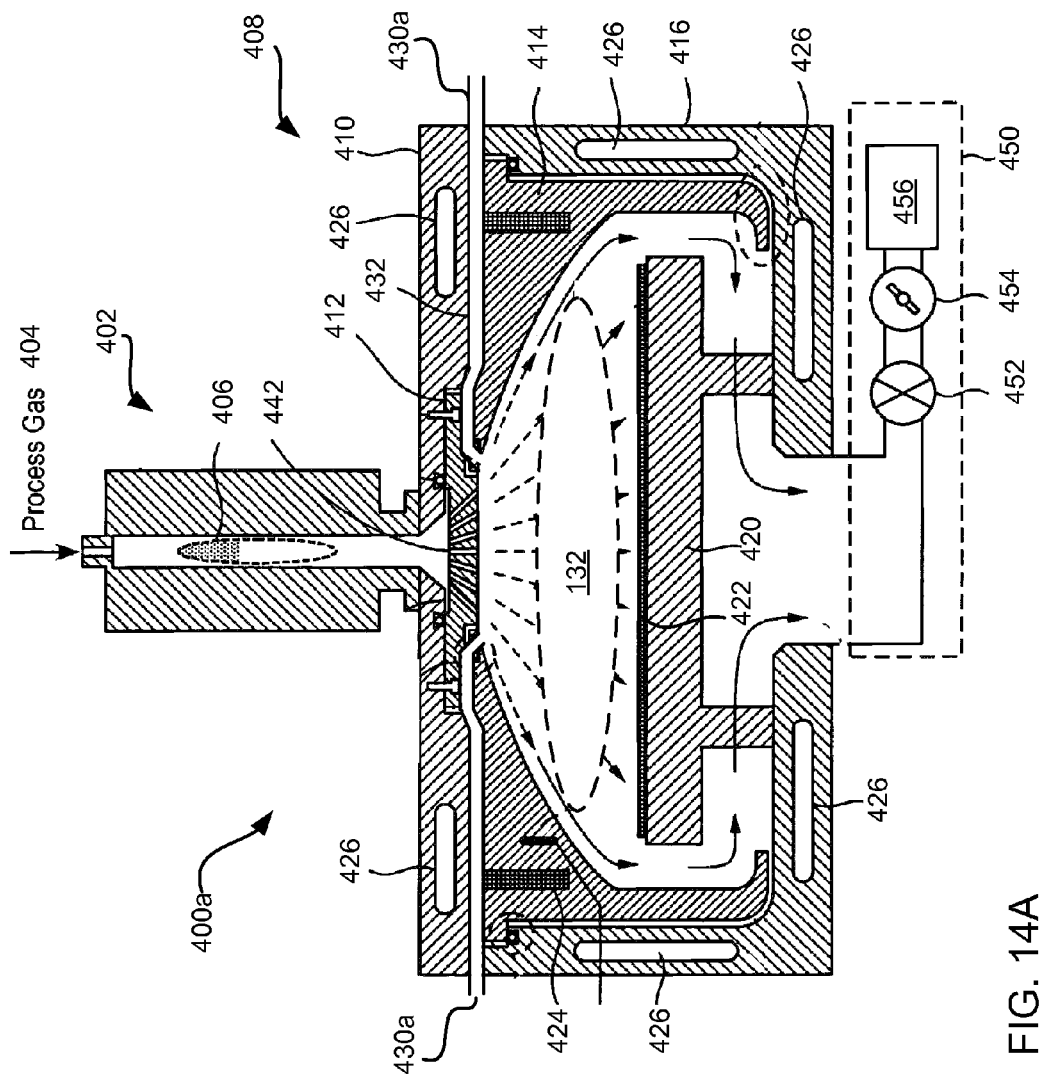
FIGS. 14A-14B schematically illustrate other examples of a plasma processing module in which an additional gas injection port is used as a water vapor inlet, in accordance with embodiments of the present invention.
Figure 14B:
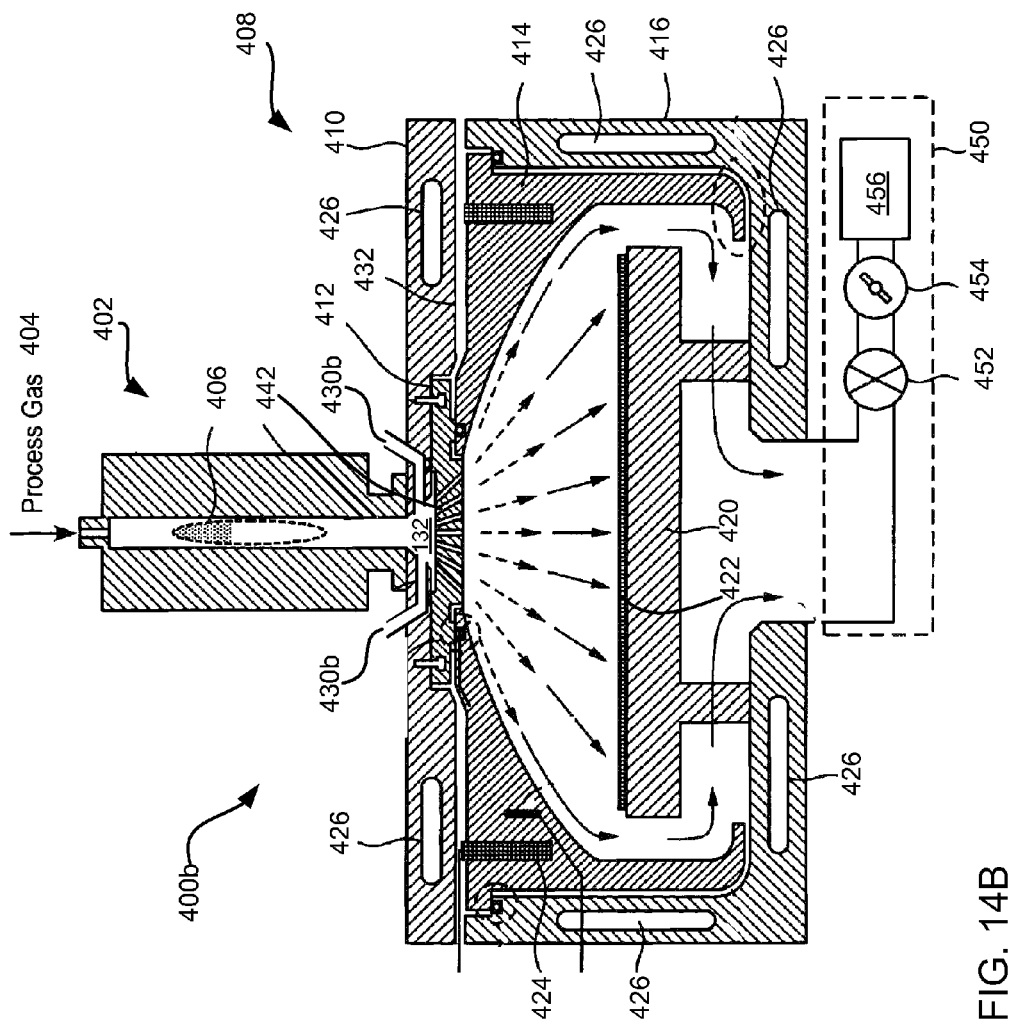

In addition, in the plasma processing module 400a (FIG. 7B) or 400b (FIG. 7C), the additional gas injection port 440a or 440b can be used as a water vapor inlet 430a or 430b so as to introduce water vapor to solvate the reaction medium, as shown in FIG. 14A and 14B. As discussed above, the water vapor inlet 430a may be provided through a gap 432 between the internal chamber body 414 and the chamber top 410 so as to have an opening in the internal chamber body 414. In this case, the reaction medium is solvated in the internal chamber body (the second chamber) 414 in the solvation zone 132. Alternatively, the additional water vapor inlet 430b may be provided downstream the plasma 406 at the conical section above the gas distribution component 412. In this case, the reaction medium is solvated in the solvation zone 132 (the conical section) before entering into the internal chamber body 414 through the gas distribution component 412. The solvation zone in FIG. 14A ensures that predominantly radicals will be solvated since the gas distribution component 412 will reduce (or possibly eliminate) ion flux. In contrast the configuration of FIG. 14B ensures that a larger fraction of ions are solvated at the expense of dissociating the water vapor or breaking the clusters. The gas distribution component 412 is configured to maximize ion pass through. In other words, the distribution holes in 412 are large enough to ensure ion passage.

Furthermore, in accordance with one embodiment of the present invention, a distance between the plasma 406 and the solvation zone 132 can be adjusted. For example, in the plasma process module 400a (FIG. 14A) or 400b (FIG. 14B), the conical section and plasma source 402 may be raised or lowered with respect to the water vapor inlet 430a or 430b.

In accordance with another embodiment of the present invention, ions from the plasma may be permitted to be present in the reaction medium to reach the wafer. The objective is to force negative ions from the plasma into the solvation zone and form negative ion clusters. Since negative ions do not escape a plasma and congregate in the middle of the plasma, the plasma needs to be shut off in order to get the negative ions out. This is accomplished by pulsing the plasma on and off. That is, the microwave or RF power to the applicator 402 is pulsed, and if there is a bias power then that power would also be pulsed. Typical off times may be 5 to 50 microseconds, and typical on times may be 5 to 200 microseconds. Negative ion production is best under lower pressures. The negative ions are solvated and transported to the wafer. Negative ions are very reactive oxidizing agents, in that they have an additional electron over the corresponding radical.

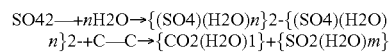

$$SO_4{}^{2-} + nH_2O \rightarrow \{(SO_4)(H_2O)n\}^{2-} \text{-} \{(SO_4)(H_2O)n\}^{2-} + C \text{—} C \rightarrow \{CO_2(H_2O)_1\} + \{SO_2(H_2O)m\}$$

This may be achieved by making the exit holes to the second chamber large enough. For example, in FIGS. 14A-14B, the gas distribution component 412 may have a plurality of gas passages 442 having larger holes such that ions pass from the plasma discharge zone 406 through the larger holes into the internal chamber body (the second chamber) 414. The same applies, for example, to the process module 100 (FIG. 9), the openings of the baffle 124 may be enlarged. In the process module 140 (FIG. 11A), the process module 160 (FIG. 11B), and the process module 180 (FIG. 10), the opening of the inner port 148 interconnecting the first chamber 142 and the second chamber 144 (or reaction chamber) can be made larger enough such that more ions will pass through. Similarly, in downstream chamber 300 (FIG. 12), the holes of the showerhead 322 can be made larger.

In addition, if the process module includes an RF power source for the lower electrode (chuck), for example, the process modules 160 or 180, a bias voltage can be provided so as to attract the charged species (ions) toward the wafer. The bias voltage may have a frequency of 13.56 MHz and above, for example, 27 MHz. In these cases, the holes of the baffles can also be enlarged. Furthermore, the top RF power source to generate plasma may be pulsed to release negative ions. In general, a continuous plasma has a sheath which prevents relatively bulky negative ions from getting past the sheath boundary. As the plasma is turned off, the sheath collapses and the negative ions are released. The quartz baffle(s) may be biased such that the negative ions will pass through the quartz baffle, for example, in the process module 100 (FIG. 10).

In addition to negative ions, positive ions will also be transported. Ions such as H+ and H3O+ are strong reducing agents. The combination of oxidation with negative ions and reduction with positive ions will effectively breakdown the photoresist while checking excessive oxidation or reduction of the active area silicon.

In all of those embodiments of this invention, the addition of fluorocarbons is employed to assist in the breakthrough of implant generated crust. The fluoride radical and negative ions are very strong oxidizers for breaking through cross-linked carbon bonds.

In accordance with another embodiment of the present invention, the timing/sequence of introducing the process gas(es) and the water vapor may be changed in order to control effects on the photoresist strip process, such as the strip rate, strip residue, amount of material loss, or other on-wafer results in general. When a wafer is placed in the second chamber separate from the first chamber where the plasma is generated, the timing of introducing the process gases into the first chamber also controls the timing of the reaction medium to flow into the second chamber with respect to the water vapor injection.

According to a first example, the process gas(es) and the water vapor may be introduced/injected into the respective locations in the chamber(s) at the same time. In a second example, the water vapor is first injected, followed by the process gases after a certain time delay. This may have different surface kinetics, and may enhance absorption. Alternatively, the process gases are introduced first, followed by injection of water vapor after a certain time delay. This sequence also has different surface kinetics. In accordance with a forth example, water vapor is first injected, then only the process gasses are introduced (i.e., the water vapor injection is being stopped during the introduction of the process gasses), followed by water vapor injection without introducing the process gases, followed by the process gases introduction without water vapor injection, and so forth. The forth example is an alternating process in which the water vapor and the process gases are introduced in an alternating and sequential manner. This may enhance surface absorption and reaction. The sequence ("water first" or "process gas first") and the time duration of each injection/introduction step may also be controlled to optimize the surface results.

In accordance with another embodiment of the present invention, a diluent gas may be added to the process gas chemistry in any of the embodiments described above.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. An apparatus for removing photoresist from a wafer, the apparatus comprising:
   a first chamber for generating a plasma from a process gas, the first chamber having a gas inlet;
   a gas source in fluid connection with the gas inlet, for providing the process gas containing sulfur (S), oxygen (O), and hydrogen (H) into the first chamber;
   a second chamber for placing the wafer having a patterned photoresist layer thereon; a solvation zone provided in a passage of a reaction medium in the second chamber flowing down from the plasma toward the wafer;
   a water vapor source connected to a water vapor inlet provided to the second chamber, the water vapor inlet introducing water vapor in the solvation zone and causing the water vapor to enter a flow of the reaction medium in the solvation zone, the water vapor inlet having a condensation nozzle to ensure mild condensation; and
   a water vapor inlet controller configured to control a pressure differential between a gas feed line of the water vapor and the solvation zone where the water vapor is injected such that the water vapor condenses as clusters around species of the reaction medium to form solvated clusters of the species in the solvation zone before the reaction medium reaches the wafer.

2. The apparatus according to claim 1, wherein the process gas contains $SO_2$, $H_2O$ and $O_2$.

3. The apparatus according to claim 2, wherein the plasma generated from the process gas includes $HSO_4$. monosulfate radical, $HSO_3$. bisulfite radical, HO. hydroxyl radical; and O. oxygen radical.

4. The apparatus according to claim 2 wherein the process gas further contains fluorine containing gas, and wherein the fluorine containing gas contains fluorocarbon.

5. The apparatus according to claim 1, wherein the water vapor inlet includes:
   a water vapor nozzle or fine orifice ensuring condensation of the water vapor around species of the reaction medium.

6. The apparatus according to claim 1, further comprising:
   at least one gas distribution component having a plurality of holes, wherein the reaction medium is transported to the wafer through the at least one gas distribution component.

7. The apparatus according to claim 6, wherein the water vapor is injected above the gas distribution component.

8. The apparatus according to claim 6, wherein the water vapor is injected below the gas distribution component.

9. The apparatus according to claim 6, wherein the water vapor is injected between two gas distribution components.

10. The apparatus according to claim 1, further comprising:
    a second gas inlet configured to inject a fluorine containing gas in the solvation zone.

11. The apparatus according to claim 1, further comprising:
    a RF power source configured to generate the plasma; and
    a bias power source configured to generate bias voltage having a frequency of 13.56 MHz and above.

12. The apparatus according to claim 11, wherein the RF power source and the bias power source are further configured to pulse the plasma discharge so as to release negative ions into the reaction medium.

13. The apparatus according to claim 1, wherein the water vapor inlet controller is further configured to control a sequence, timing, and time duration of injection of the water vapor through the water vapor inlet and injection of the process gas through the gas inlet.

14. An apparatus for removing photoresist from a wafer, the apparatus comprising:
    a first chamber for generating a plasma from a process gas, the first chamber having a gas inlet;
    a gas source in fluid connection with the gas inlet, for providing the process gas containing sulfur (S), oxygen (O), and hydrogen (H) into the first chamber;
    a second chamber for placing the wafer having a patterned photoresist layer thereon; a solvation zone provided in a passage of a reaction medium in the second chamber flowing down from the plasma toward the wafer;

a water vapor source connected to a water vapor inlet provided to the second chamber, the water vapor inlet introducing water vapor in the solvation zone and causing the water vapor to enter a flow of the reaction medium in the solvation zone, the water vapor inlet having a condensation orifice to ensure mild condensation; and a water vapor inlet controller configured to control a pressure differential between a gas feed line of the water vapor and the solvation zone where the water vapor is injected such that the water vapor condenses as clusters around species of the reaction medium to form solvated clusters of the species in the solvation zone before the reaction medium reaches the wafer.

* * * * *